(12) United States Patent
Choi et al.

(10) Patent No.: US 8,766,691 B2
(45) Date of Patent: Jul. 1, 2014

(54) DUTY CYCLE ERROR ACCUMULATION CIRCUIT AND DUTY CYCLE CORRECTION CIRCUIT HAVING THE SAME

(71) Applicant: Samsung Electronics Co., Ltd., Suwon-si (KR)

(72) Inventors: Jong-Ryun Choi, Hwaseong-si (KR); Ji-Hun Oh, Hwaseong-si (KR); Choong-Bin Lim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/835,824

(22) Filed: Mar. 15, 2013

(65) Prior Publication Data

US 2014/0002157 A1    Jan. 2, 2014

(30) Foreign Application Priority Data

Jun. 29, 2012    (KR) .......................... 10-2012-0070930

(51) Int. Cl.
*H03K 3/017*    (2006.01)
(52) U.S. Cl.
USPC .............................. 327/175; 327/35; 327/172
(58) Field of Classification Search
CPC ......... G01R 29/023; H03K 5/01; H03K 5/04; H03K 5/06; H03K 5/14; H03K 5/22
USPC ...................... 327/31, 35, 170–175
See application file for complete search history.

(56) References Cited

U.S. PATENT DOCUMENTS

| | | | |
|---|---|---|---|
| 6,411,145 B1 * | 6/2002 | Kueng et al. .................. | 327/175 |
| 6,967,514 B2 * | 11/2005 | Kizer et al. .................... | 327/175 |
| 6,981,185 B1 | 12/2005 | Davis et al. | |
| 7,116,149 B2 | 10/2006 | Kim | |
| 7,382,309 B2 | 6/2008 | Kim et al. | |
| 7,839,194 B2 | 11/2010 | Chang et al. | |
| 7,847,609 B2 * | 12/2010 | Shin .............................. | 327/175 |
| 8,207,772 B2 * | 6/2012 | Shin .............................. | 327/175 |
| 2011/0068763 A1 | 3/2011 | Chang et al. | |
| 2011/0128059 A1 | 6/2011 | Kim et al. | |

* cited by examiner

*Primary Examiner* — An Luu
(74) *Attorney, Agent, or Firm* — Stanzione & Kim, LLP

(57) ABSTRACT

A duty cycle error accumulation circuit includes first to nth delay units and a feedback unit. The first to nth delay units receive a clock signal, a first input signal and a second input signal, respectively, to generate a first output signal and a second output signal by delaying one signal selected from first and second input signals based on a logic level of the clock signal. The feedback unit supplies second input signal to a kth delay unit based on second output signal of a (k+1)th delay unit. The first output signal of the kth delay unit is supplied to the (k+1)th delay unit as first input signal, and the clock signal is supplied to the first delay unit as first input signal and to the nth delay unit as second input signal. The duty cycle error accumulation circuit effectively corrects a duty cycle of a clock signal.

20 Claims, 11 Drawing Sheets

DUTY CYCLE ERROR ACCUMULATION CIRCUIT AND DUTY CYCLE CORRECTION CIRCUIT HAVING THE SAME

CROSS-REFERENCE TO RELATED APPLICATIONS

This application claims priority under 35 USC §119 to Korean Patent Application No. 10-2012-0070930, filed on Jun. 29, 2012, in the Korean Intellectual Property Office (KIPO), the contents of which are herein incorporated by reference in their entirety.

BACKGROUND

1. Field

Example embodiments relate generally to a duty cycle correction circuit, and more particularly to a duty cycle error accumulation circuit capable of precisely detecting duty cycle errors by accumulating the duty cycle errors for a plurality of periods and a duty cycle correction circuit having the same.

2. Description of the Related Art

Components, such as a processor and a memory included in a general electronic device, transceive data in synchronization with clock signals. However, errors may occur when the data are transceived between the components if a duty cycle error occurs due to a mismatch in length between a logic low level duration and a logic high level in the clock signal.

For instance, in the case of a double data rate (DDR) memory, the data are transceived at every rising edge and falling edge of the clock signal. If the duty cycle error occurs in the clock signal, a data transceiving interval may not be constantly maintained, so an error may occur when the data are transceived between the DDR memory and the processor.

Therefore, the duty cycle error of the clock signal has to be kept below a predetermined level for the normal operation of electronic devices.

Recently, as the clock frequency of the electronic device is gradually increased, an allowable value of the duty cycle error of the clock signal is also gradually reduced. Thus, a duty cycle correction circuit capable of precisely detecting the duty cycle error of the clock signal is necessary to correct the duty cycle error of the clock signal.

SUMMARY

Some example embodiments provide a duty cycle error accumulation circuit capable of precisely detecting duty cycle errors by accumulating the duty cycle errors of clock signals for a plurality of periods.

Some example embodiments provide a duty cycle correction circuit having such a duty cycle error accumulation circuit.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a duty cycle error accumulation circuit including first to $n^{th}$ delay units (n is an integer of 2 or more) and a feedback unit. The first to $n^{th}$ delay units receive a clock signal, a first input signal and a second input signal, respectively, to generate a first output signal and a second output signal by delaying one signal selected from the first and second input signals based on a logic level of the clock signal. The feedback unit supplies the second input signal to a $k^{th}$ delay unit based on the second output signal of a $(k+1)^{th}$ delay unit (k is a positive integer of (n−1) or less). The first output signal of the $k^{th}$ delay unit is supplied to the $(k+1)^{th}$ delay unit as the first input signal, and the clock signal is supplied to the first delay unit as the first input signal and to the $n^{th}$ delay unit as the second input signal.

In exemplary embodiments, each of the first to $n^{th}$ delay units may generate the first output signal by delaying the first input signal for a first time when the clock signal has a logic low level, and generate the second output signal by delaying the second input signal for a second time different from the first time when the clock signal has a logic high level.

In exemplary embodiments, each of the first to $n^{th}$ delay units may include a first PMOS transistor including a drain, a source connected to a supply voltage, and a gate to which the clock signal is applied, a second PMOS transistor including a source connected to the drain of the first PMOS transistor, a drain connected to a first node, and a gate to which the first input signal is applied, a first NMOS transistor including a drain, a source connected to a ground voltage, and a gate to which the clock signal is applied, a second NMOS transistor including a source connected to the drain of the first NMOS transistor, a drain connected to the first node, and a gate to which the second input signal is applied, a first inverter that generates the first output signal by inversing a voltage of the first node, and a second inverter that generates the second output signal by inversing the voltage of the first node.

The first and second PMOS transistors may have an aspect ratio (W/L) higher than the aspect ratio of the first and second NMOS transistors.

The first inverter may have a threshold voltage higher than the threshold voltage of the second inverter.

In exemplary embodiments, the feedback unit may include first to $(n-1)^{th}$ AND gates in which a $k^{th}$ AND gate supplies a result of an AND operation for the second output signal of the $(k+1)^{th}$ delay unit and the clock signal to the $k^{th}$ delay unit as the second input signal.

In exemplary embodiments, the duty cycle error accumulation circuit may further include a reset control unit that receives a reset signal and an input clock signal, supplies a signal maintained at a first logic level to the first to $n^{th}$ delay units and the feedback unit as the clock signal when the reset signal is activated, and supplies the input clock signal to the first to $n^{th}$ delay units and the feedback unit as the clock signal from a time point at which the input clock signal is transited into a second logic level when the reset signal is inactivated.

The foregoing and/or other features and utilities of the present general inventive concept may also be achieved by providing a duty cycle correction circuit including a duty cycle control unit, an inverter, a first duty cycle error accumulation circuit, a second duty cycle error accumulation circuit, and a control unit. The duty cycle control unit may generate an output clock signal by correcting a duty cycle of an input clock signal based on a duty cycle correction signal. The inverter may generate an inverse clock signal by inversing the output clock signal. The first duty cycle error accumulation circuit may generate a first accumulation signal based on an accumulation length of a logic high level duration of the output clock signal and an accumulation length of a logic low level duration of the output clock signal for m periods (m is an integer of 2 or more). The second duty cycle error accumulation circuit may generate a second accumulation signal based on an accumulation length of a logic high level duration of the inverse clock signal and an accumulation length of a logic low level duration of the inverse clock signal for the m periods. The control unit may generate the duty cycle correction signal by comparing the first accumulation signal with the second accumulation signal.

In exemplary embodiments, the first duty cycle error accumulation circuit may receive the output clock signal as an internal clock signal, and the second duty cycle error accumulation circuit may receive the inverse clock signal as the internal clock signal. Each of the first and second duty cycle error accumulation circuits may comprise first to $n^{th}$ delay units (n is an integer of 2 or more) that receive the internal clock signal, a first input signal and a second input signal, respectively, to generate a first output signal and a second output signal by delaying one signal selected from the first and second input signals based on a logic level of the internal clock signal, and a feedback unit that supplies the second input signal to a $k^{th}$ delay unit based on the second output signal of a $(k+1)^{th}$ delay unit (k is a positive integer of (n−1) or less). The first output signal of the $k^{th}$ delay unit may be supplied to the $(k+1)^{th}$ delay unit as the first input signal, and the internal clock signal may be supplied to the first delay unit as the first input signal and to the $n^{th}$ delay unit as the second input signal. The first accumulation signal may include the first output signals of the first to $n^{th}$ delay units included in the first duty cycle error accumulation circuit and the second accumulation signal may include the first output signals of the first to $n^{th}$ delay units included in the second duty cycle error accumulation circuit.

The control unit may control the duty cycle control unit through the duty cycle correction signal to reduce a width of a logic low level of the input clock signal when a number of bits that consecutively have a value of 0 in the first accumulation signal is larger than a number of bits that consecutively have a value of 0 in the second accumulation signal, and control the duty cycle control unit through the duty cycle correction signal to increase the width of the logic low level of the input clock signal when the number of bits that consecutively have the value of 0 in the first accumulation signal is smaller than the number of bits that consecutively have the value of 0 in the second accumulation signal.

In exemplary embodiments, the duty cycle correction circuit may further include a multiplexer that supplies the output clock signal to the second duty cycle error accumulation circuit in a first mode and supplies the inverse clock signal to the second duty cycle error accumulation circuit in a second mode based on a mode signal, and a calibration unit that supplies a corrected clock signal to the first duty cycle error accumulation circuit by correcting a duty cycle of the output clock signal based on a calibration signal. The control unit may supply the mode signal to the multiplexer according to a mode, generate the calibration signal by comparing the first accumulation signal with the second accumulation signal in the first mode to supply the calibration signal to the calibration unit, and generate the duty cycle correction signal in the second mode to supply the duty cycle correction signal to the duty cycle control unit.

In the first mode, the control unit may control the calibration unit through the calibration signal to reduce a width of a logic low level of the output clock signal when a number of bits that consecutively have a value of 0 in the first accumulation signal is larger than a number of bits that consecutively have a value of 0 in the second accumulation signal, control the calibration unit through the calibration signal to increase the width of the logic low level of the output clock signal when the number of bits that consecutively have the value of 0 in the first accumulation signal is smaller than the number of bits that consecutively have the value of 0 in the second accumulation signal, and supply the mode signal corresponding to the second mode to the multiplexer to operate in the second mode when the number of bits that consecutively have the value of 0 in the first accumulation signal is equal to the number of bits that consecutively have the value of 0 in the second accumulation signal.

In the first mode, the duty cycle correction circuit may further include a multiplexer that outputs the output clock signal in a first mode and outputs the inverse clock signal in a second mode based on a mode signal, and a calibration unit that supplies a corrected clock signal to the second duty cycle error accumulation circuit by correcting a duty cycle of an output signal of the multiplexer based on a calibration signal. The control unit may supply the mode signal to the multiplexer according to a mode, generate the calibration signal by comparing the first accumulation signal with the second accumulation signal in the first mode to supply the calibration signal to the calibration unit, and generate the duty cycle correction signal in the second mode to supply the duty cycle correction signal to the duty cycle control unit.

In the first mode, the control unit may control the calibration unit through the calibration signal to increase a width of a logic low level of the output signal of the multiplexer when a number of bits that consecutively have a value of 0 in the first accumulation signal is larger than a number of bits that consecutively have a value of 0 in the second accumulation signal, control the calibration unit through the calibration signal to reduce the width of the logic low level of the output signal of the multiplexer when the number of bits that consecutively have the value of 0 in the first accumulation signal is smaller than the number of bits that consecutively have the value of 0 in the second accumulation signal, and supply the mode signal corresponding to the second mode to the multiplexer to operate in the second mode when the number of bits that consecutively have the value of 0 in the first accumulation signal is equal to the number of bits that consecutively have the value of 0 in the second accumulation signal.

The foregoing and/or other features and utilities of the present general inventive concept may also be achieved by providing a duty cycle error accumulation circuit, including a plurality of delay units disposed to operate in a first order to generate a first set of accumulation signals during a first level of a clock signal and to operate in a second order to generate a second set of accumulation signals during a second level of the clock signal such that a difference between the first set of accumulation signals and the second set of accumulation signals indicates a duty cycle error of a cycle of the clock signal.

The delay units may be connected in series, and each of the delay units may be connected between two different potentials to receive a combination of one or more of the clock signal, an output signal generated from a first adjacent delay unit as a first input, an output signal generated from a second adjacent delay unit as a second input.

The delay units each may include a transistor group and a first converter and a second converter commonly connected to an output of the transistor group. The first converter may have a first threshold and the second converter has a second threshold. The first converter may output the accumulation signals in the first order and in the second order according to the respective first and second levels according to the first threshold and the output of the transistor group.

The delay units may repeat the operations in the first order and the second order in the respective cycles of the clock signal to generate first sets of the accumulation signals and second sets of the accumulation signals such that a difference between the first sets of the accumulation signals and the second sets of the accumulation signal indicates the duty cycle error of the cycles of the clock signal.

The foregoing and/or other features and utilities of the present general inventive concept may also be achieved by providing a duty cycle error correction circuit including a duty cycle control unit, the duty cycle error accumulation circuits described above or hereinafter to generate the first and second set of accumulation signals, and a control unit to generate an error correction signal to control the duty cycle control unit to correct the duty cycle of the clock signal according to the error correction signal.

The foregoing and/or other features and utilities of the present general inventive concept may also be achieved by providing an electronic apparatus including a clock generator to generate the clock signal, the duty cycle error correction circuit describe above or hereinafter, and a functional unit to perform a function of the electronic apparatus according to the corrected clock signal.

The foregoing and/or other features and utilities of the present general inventive concept may also be achieved by providing a method of generating a duty cycle error of a clock signal in a duty cycle error accumulation circuit, the method including operating a plurality of delay units in a first order to generate a first set of accumulation signals during a first level of a clock signal, and operating the delay units in a second order to generate a second set of accumulation signals during a second level of the clock signal, wherein a difference between the first set of accumulation signals and the second set of accumulation signals indicates a duty cycle error of a cycle of the clock signal.

The foregoing and/or other features and utilities of the present general inventive concept may also be achieved by providing a computer-readable medium to contain computer-readable codes as a program to perform a method described above or hereinafter.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
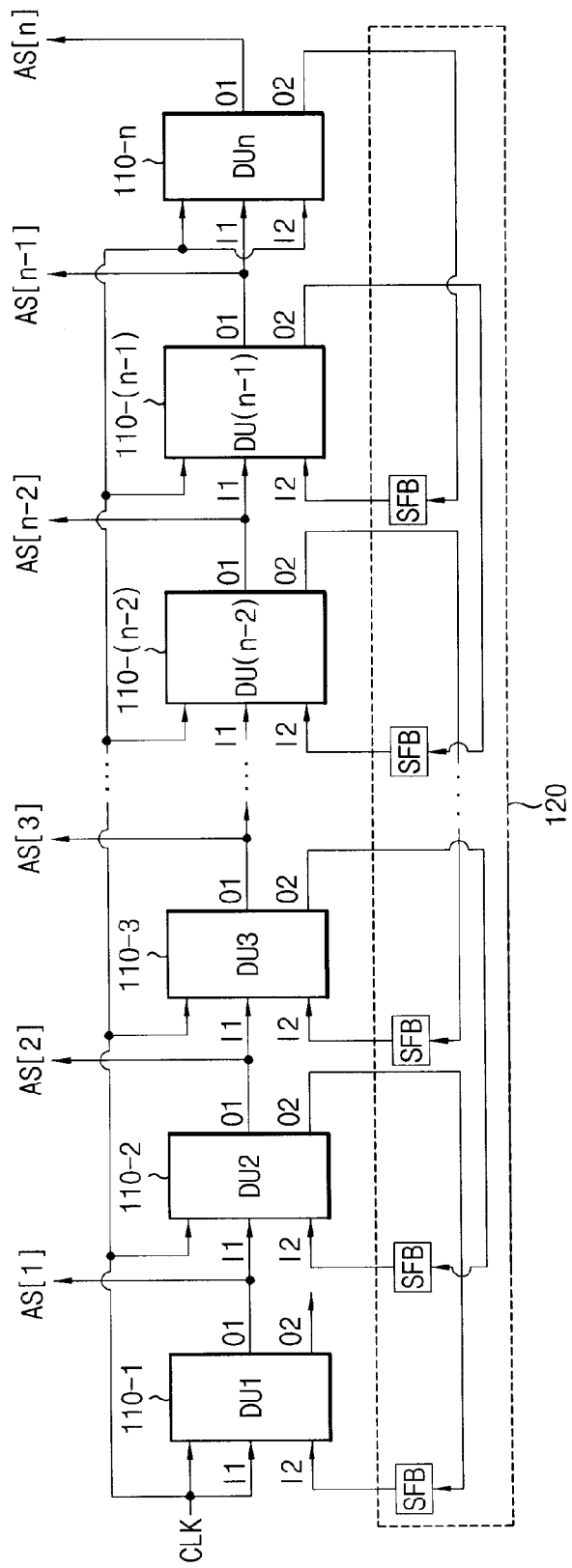
FIG. 1 is a block diagram illustrating a duty cycle error accumulation circuit according to an exemplary embodiment of the present general inventive concept.

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a duty cycle error accumulation circuit 100 according to an exemplary embodiment of the present general inventive concept.

Referring to FIG. 1, the duty cycle error accumulation circuit 100 includes first to $n^{th}$ delay units (DU1, DU2, DU3, . . . , DU(n-2), DU(n-1) and DUn) 110-1, 110-2, 110-3, . . . , 110-(n-2), 110-(n-1) and 110-n and a feedback unit 120, wherein n is an integer of 2 or more.

Each of the first to $n^{th}$ delay units 110-1, 110-2, 110-3, . . . , 110-(n-2), 110-(n-1) and 110-n receives a clock signal CLK, a first input signal I1 and a second input signal I2. Each of the first to $n^{th}$ delay units 110-1, 110-2, 110-3, ..., 110-(n−2), 110-(n−1) and 110-n selects one of the first input signal I1 and the second input signal I2 based on the logic level of the clock signal CLK and delays the selected signal to generate a first output signal O1 and a second output signal O2.

The first output signal O1 of a $k^{th}$ delay unit is transmitted to a $(k+1)^{th}$ delay unit as the first input signal I1, so the first to $n^{th}$ delay units 110-1, 110-2, 110-3, ..., 110-(n−2), 110-(n−1) and 110-n are sequentially connected with each other, wherein k is an integer of (n−1) or less.

The first input signal I1 of the first delay unit 110-1 positioned at the first stage among the first to $n^{th}$ delay units 110-1, 110-2, 110-3, ..., 110-(n−2), 110-(n−1) and 110-n is the clock signal CLK.

The feedback unit 120 includes first to $(n-1)^{th}$ sub-feedback units SFB, and a $k^{th}$ sub-feedback unit transmits the second input signal I2 to the $k^{th}$ delay unit based on the second output signal O2 of the $(k+1)^{th}$ delay unit. According to the example embodiment, each of the first to $(n-1)^{th}$ sub-feedback units SFB may supply the second output signal O2 as the second input signal I2 to the $k^{th}$ delay unit by bypassing (hereinafter, bypassing may be referred to as outputting) the received second output signal O2 of the $(k+1)^{th}$ delay unit, and may supply the result of the AND operation for the second output signal O2 of the $(k+1)^{th}$ delay unit and the clock signal CLK to the $k^{th}$ delay unit as the second input signal.

The second input signal I2 of the $n^{th}$ delay unit 110-n positioned at the last stage among the first to $n^{th}$ delay units 110-1, 110-2, 110-3, ..., 110-(n−2), 110-(n−1) and 110-n is the clock signal CLK.

Meanwhile, the duty cycle error accumulation circuit 100 outputs an accumulation signal AS including first output signals O1 of the first to $n^{th}$ delay units 110-1, 110-2, 110-3, ..., 110-(n−2), 110-(n−1) and 110-n. That is, as shown in FIG. 1, the first output signals O1 of the first to $n^{th}$ delay units 110-1, 110-2, 110-3, ..., 110-(n−2), 110-(n−1) and 110-n may serve as first to $n^{th}$ bits AS[1], AS[2], AS[3], ..., AS[n−2], AS[n−1], and AS[n] of the accumulation signal, respectively.

According to the exemplary embodiment, when the clock signal CLK has a logic low level (or a first level), each of the first to $n^{th}$ delay units 110-1, 110-2, 110-3, ..., 110-(n−2), 110-(n−1) and 110-n delays the first input signal I1 for a first time to generate the first output signal O1. In addition, when the clock signal CLK has a logic high level (or a second level), each of the first to $n^{th}$ delay units 110-1, 110-2, 110-3, ..., 110-(n−2), 110-(n−1) and 110-n delays the second input signal I2 for a second time to generate the second output signal O2. The second time may be different from the first time.

Therefore, as will be described later, the first input signal I1 having a value of '0' is sequentially transmitted from the first delay unit 110-1 to the $n^{th}$ delay unit 110-n through the first output signal O1 at an interval of the first time for the duration where the clock signal CLK has the logic low level and the second input signal I2 having a value of '1' is sequentially transmitted in the reverse direction through the second output signal O2 at an interval of the second time for the duration where the clock signal CLK has the logic high level.

At this time, since the first time interval is different from the second time interval, a transmission distance of the first input signal I1 having the value of '0' from the first delay unit 110-1 to the $n^{th}$ delay unit 110-n is different from a transmission distance of the second input signal I2 having the value of '1' during one period of the clock signal CLK. The duty cycle error accumulation circuit 100 accumulates such a difference for a plurality of periods, so the duty cycle error accumulation circuit 100 can precisely detect a fine duty cycle error. Meanwhile, as the number of periods to accumulate the duty cycle error is increased, a resolution (accuracy) of the duty cycle error detected by the duty cycle error accumulation circuit 100 can be improved. The transmission distance may be referred to as a difference between sequential operating times of the corresponding delay units.

Figure 2:
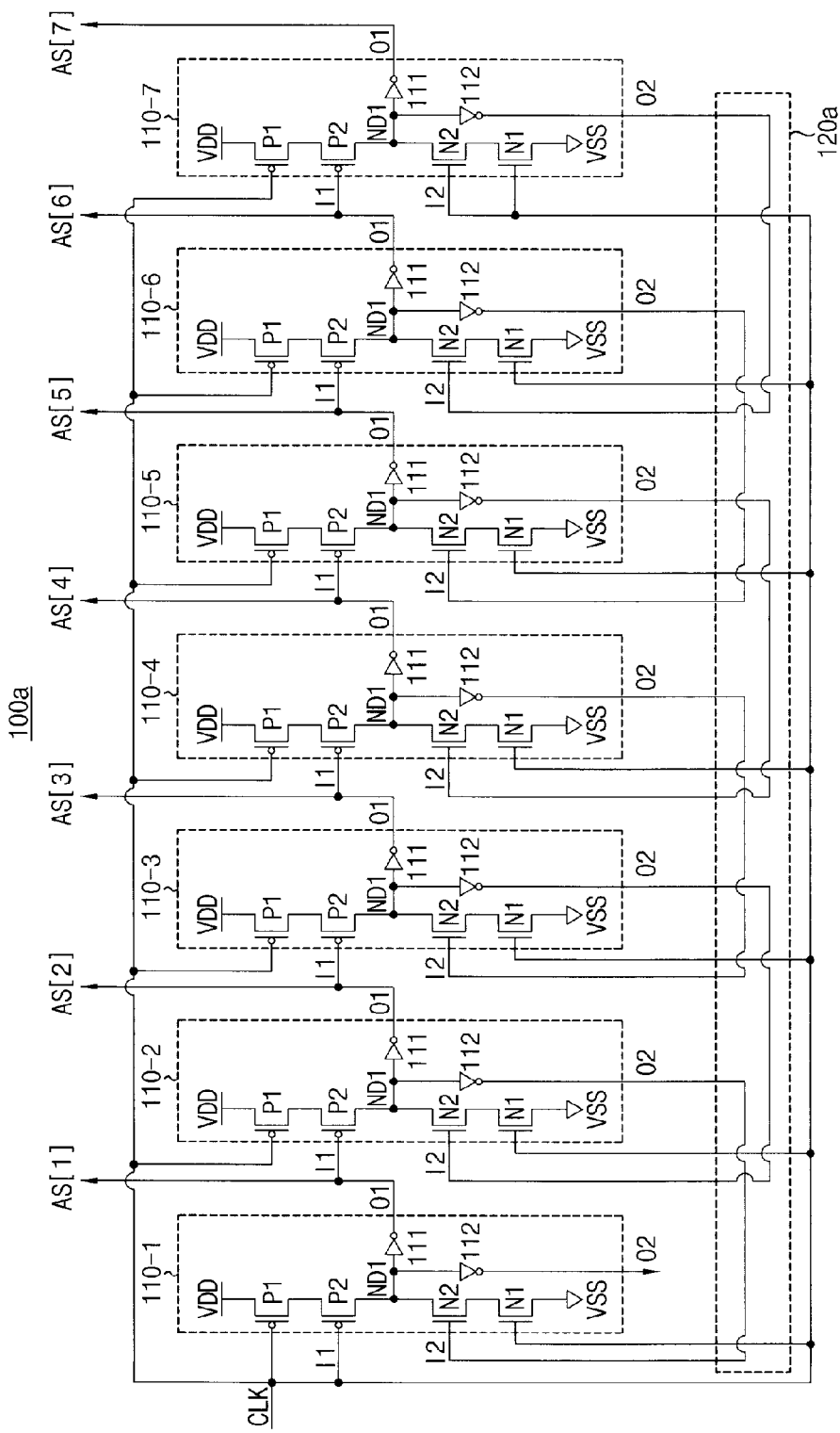
FIG. 2 is a circuit diagram illustrating the duty cycle error accumulation circuit illustrated in FIG. 1.

FIG. 2 is a circuit diagram illustrating a duty cycle error accumulation circuit 100a according to an embodiment of the present general inventive concept. The duty cycle error accumulation circuit 100a of FIG. 2 may be the circuit 100 of FIG. 1

Referring to FIG. 2, the duty cycle error accumulation circuit 100a may include first to seventh delay units 110-1, 110-2, 110-3, 110-4, 110-5, 110-6 and 110-7 and a feedback unit 120a.

Although FIG. 2 illustrates the case in which n is 7, the present general inventive concept is not limited thereto. It is possible that n may be less or higher than 7.

Each of the first to seventh delay units 110-1, 110-2, 110-3, 110-4, 110-5, 110-6 and 110-7 may include a first PMOS (p-type metal oxide semiconductor) transistor P1, a second PMOS transistor P2, a first NMOS (n-type metal oxide semiconductor) transistor N1, a second NMOS transistor N2, a first inverter 111 and a second inverter 112.

The first PMOS transistor P1 may include a source connected to a supply voltage VDD and a gate to which the clock signal CLK is applied.

The second PMOS transistor P2 may include a source connected to a drain of the first PMOS transistor P1, a drain connected to a first node ND1 and a gate to which the first input signal I1 is applied.

The first NMOS transistor N1 may include a source connected to a ground voltage VSS and a gate to which the clock signal CLK is applied.

The second NMOS transistor N2 may include a source connected to the drain of the first NMOS transistor N1, a drain connected to the first node ND1 and a gate to which the second input signal I2 is applied.

According to the exemplary embodiment, an aspect ratio (W/L) of the first and second PMOS transistors P1 and P2 may be higher than an aspect ratio (W/L) of the first and second NMOS transistors N1 and N2. In this case, a rise transition rate of a voltage in the first node ND1, which is measured as charges from the supply voltage VDD are charged in the first node ND1 due to a turn-on of the first and second PMOS transistors P1 and P2, may be higher than a fall transition rate of a voltage in the first node ND1, which is measured when the charges in the first node ND1 are discharged to the ground voltage VSS due to a turn-on of the first and second NMOS transistors N1 and N2.

The first inverter 111 may generate the first output signal O1 by inversing the voltage of the first node ND1.

The second inverter 112 may generate the second output signal O2 by inversing the voltage of the first node ND1.

Figure 3:
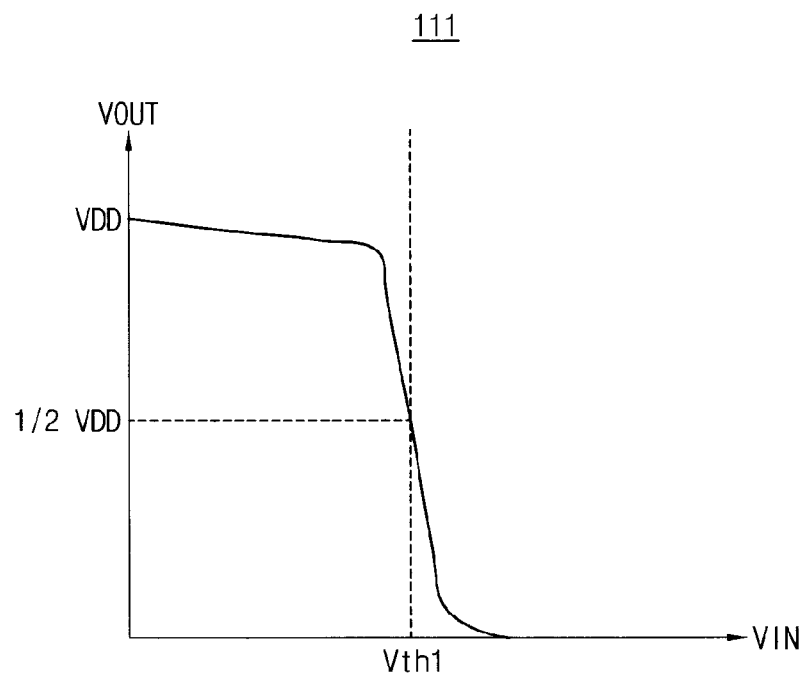
FIG. 3 is a graph illustrating input/output characteristics of a first inverter included in delay units of FIG. 2.
Figure 4:
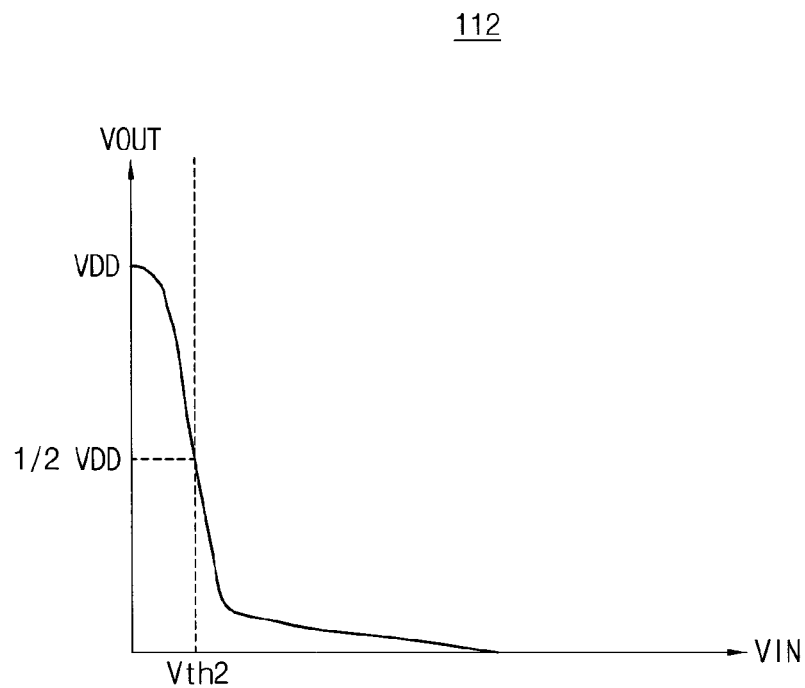
FIG. 4 is a graph illustrating input/output characteristics of a second inverter included in delay units of FIG. 2.

FIG. 3 is a graph illustrating input/output characteristics of the first inverter 111 included in the first to seventh delay units 110-1, 110-2, 110-3, 110-4, 110-5, 110-6 and 110-7 illustrated in FIG. 2, and FIG. 4 is a graph illustrating input/output characteristics of the second inverter 112 included in the first to seventh delay units 110-1, 110-2, 110-3, 110-4, 110-5, 110-6 and 110-7 illustrated in FIG. 2.

Referring to FIGS. 3 and 4, a threshold voltage Vth1 of the first inverter 111 is higher than a threshold voltage Vth2 of the second inverter 112.

Thus, when a voltage of the first node ND1 is raised from the ground voltage VSS to the supply voltage VDD due to the turn-on of the first and second PMOS transistors P1 and P2, the voltage of the first node ND1 reaches the threshold voltage Vth2 of the second inverter 112 and then reaches the threshold voltage Vth1 of the first inverter 111. Therefore, if the voltage of the first node ND1 is raised from the ground voltage VSS to the supply voltage VDD, the second output voltage O2 output from the second inverter 112 is transited from the logic high level to the logic low level and then the first output voltage O1 output from the first inverter 111 is transited from the logic high level to the logic low level.

When the voltage of the first node ND1 falls from the supply voltage VDD to the ground voltage VSS due to the turn-on of the first and second NMOS transistors N1 and N2, the voltage of the first node ND1 reaches the threshold voltage Vth1 of the first inverter 111 and then reaches the threshold voltage Vth2 of the second inverter 112. Therefore, if the voltage of the first node ND1 falls from the supply voltage VDD to the ground voltage VSS, the first output voltage O1 output from the first inverter 111 is transited from the logic low level to the logic high level and then the second output voltage O2 output from the second inverter 112 is transited from the logic low level to the logic high level.

According to the exemplary embodiment, the intensity (amount or level) of the threshold voltage Vth1 of the first inverter 111 may be a first portion, for example, about 90%, based on the intensity (amount or level) of the supply voltage VDD, and the intensity of the threshold voltage Vth2 of the second inverter 112 may be about a second portion, for example, 10%, based on the intensity of the supply voltage VDD.

Referring again to FIG. 2, the feedback unit 120a may supply the second input signal I2 to the $k^{th}$ delay unit by bypassing the received second output signal O2 of the $(k+1)^{th}$ delay unit.

Figure 5:
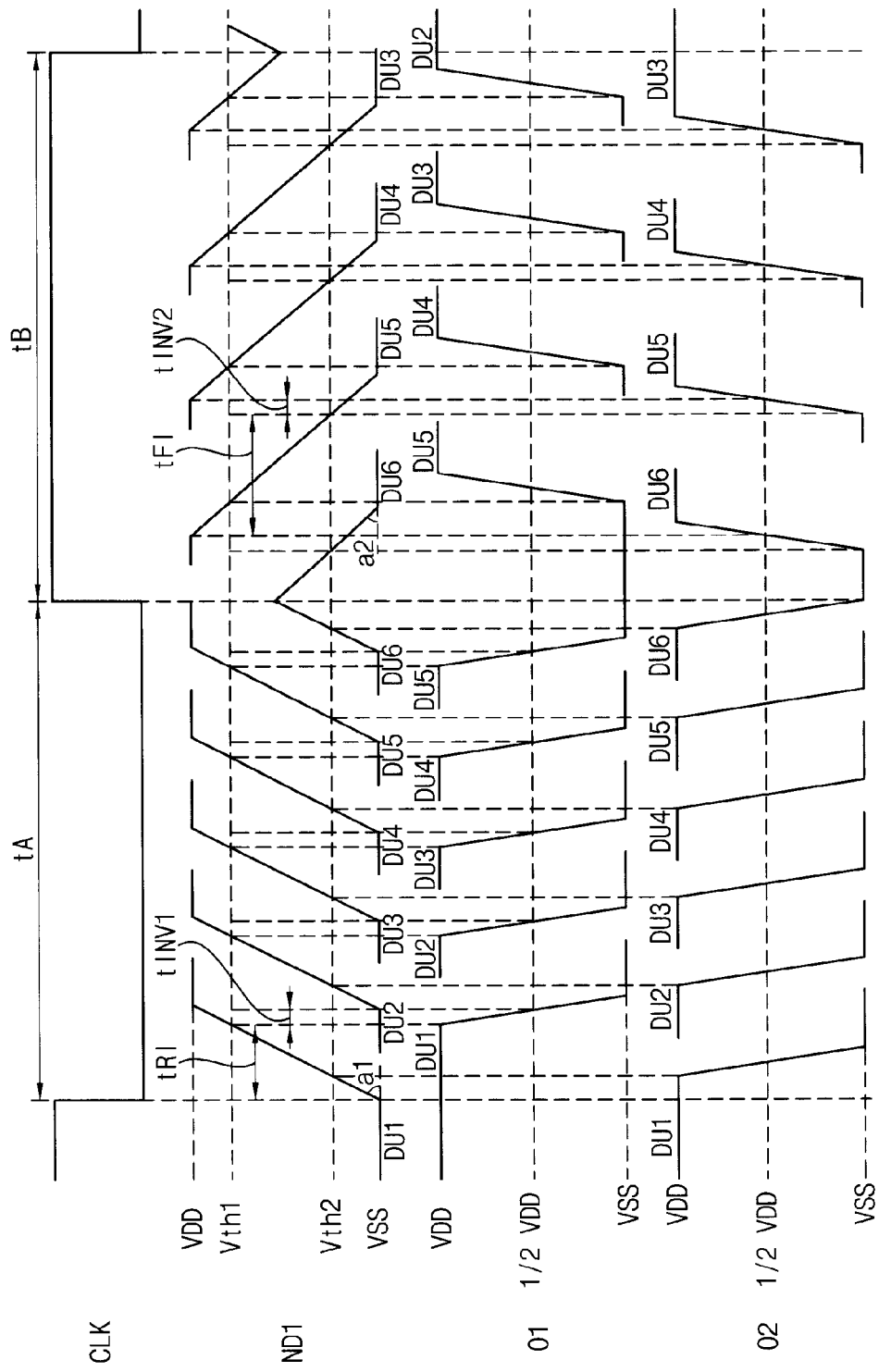
FIG. 5 is a timing diagram illustrating an operation of the duty cycle error accumulation circuit of FIG. 2.

FIG. 5 is a timing diagram illustrating an operation of the duty cycle error accumulation circuit of FIG. 2.

Hereinafter, the operation of the duty cycle error accumulation circuit of FIG. 2 will be described with reference to FIGS. 2 and 5.

In the following description, a voltage drop in the first and second PMOS transistors P1 and P2 and the first and second NMOS transistors N1 and N2 included in the first to seventh delay units 110-1, 110-2, 110-3, 110-4, 110-5, 110-6 and 110-7 will be disregarded.

Referring to FIG. 5, a length of the logic low level duration of the clock signal CLK is a third time tA and a length of the logic high level duration of the clock signal CLK is a fourth time tB. A sum of the third time tA and the fourth time tB is referred to as one period of the clock signal CLK.

In an initial operation of the duty cycle error accumulation circuit 100a, the clock signal CLK is maintained in the logic high level. Thus, all first PMOS transistors P1 included in the first to seventh delay units 110-1, 110-2, 110-3, 110-4, 110-5, 110-6 and 110-7 are turned off and the first and second NMOS transistors N1 and N2 of the seventh delay unit 110-7 are turned on. Thus, the charges in the first node ND1 of the seventh delay unit 110-7 are discharged to the ground voltage VSS through the first and second NMOS transistors N1 and N2 so that the voltage of the first node ND1 has the logic low level. Therefore, the first inverter 111 outputs the first output signal O1 having the logic high level, so the seventh bit AS[7] of the accumulation signal AS output from the duty cycle error accumulation circuit 100a becomes '1.' Meanwhile, the second inverter 112 also outputs the second output signal O2 having the logic high level, and the second output signal O2 serves as the second input signal I2 of the sixth delay unit 110-6.

Thus, the first and second NMOS transistors N1 and N2 of the sixth delay unit 110-6 are turned on and the charges in the first node ND1 of the sixth delay unit 110-6 are discharged to the ground voltage VSS through the first and second NMOS transistors N1 and N2 so that the voltage of the first node ND1 has the logic low level. Therefore, the first inverter 111 outputs the first output signal O1 having the logic high level, so the sixth bit AS[6] of the accumulation signal AS output from the duty cycle error accumulation circuit 100a becomes '1.' Meanwhile, the second inverter 112 also outputs the second output signal O2 having the logic high level, and the second output signal O2 serves as the second input signal I2 of the fifth delay unit 110-5.

The above process is sequentially repeated from the seventh delay unit 110-7 to the first delay unit 110-1. Thus, in the initial operation where the clock signal CLK is maintained in the logic high level, the first and second PMOS transistors P1 and P2 included in the first to seventh delay units 110-1, 110-2, 110-3, 110-4, 110-5, 110-6 and 110-7 are turned off, the first and second NMOS transistors N1 and N2 are turned on, the voltage of the first node ND1 has the logic low level, and all bits of the accumulation signal AS become '1'.

If the clock signal CLK is transited into the logic low level, all first NMOS transistors N1 included in the first to seventh delay units 110-1, 110-2, 110-3, 110-4, 110-5, 110-6 and 110-7 are turned off so that the first node ND1 is electrically blocked from the ground voltage VSS. In addition, all first PMOS transistors P1 included in the first to seventh delay units 110-1, 110-2, 110-3, 110-4, 110-5, 110-6 and 110-7 are turned on.

Since the first input signal I1 of the first delay unit (DU1) 110-1 is the clock signal CLK, the second PMOS transistor P2 of the first delay unit (DU1) 110-1 is turned on. Thus, the charges from the supply voltage VDD are charged in the first node ND1 of the first delay unit (DU1) 110-1 through the first and second PMOS transistors P1 and P2 so that the voltage of the first node ND1 is raised.

At this time, as illustrated in FIG. 5, the voltage of the first node ND1 may be raised corresponding to a first gradient a1 ranging from the ground voltage VSS to the supply voltage VDD. The first gradient a1 is increased as an aspect ratio (W/L) of the first and second PMOS transistors P1 and P2 becomes increased.

As described above, the threshold voltage Vth1 of the first inverter 111 is higher than the threshold voltage Vth2 of the second inverter 112. Thus, the voltage of the first node ND1 of the first delay unit (DU1) 110-1 reaches the threshold voltage Vth2 of the second inverter 112 during a rise transition. At this time, the second output signal O2 output from the second inverter 112 is dropped from the supply voltage VDD to the ground voltage VSS. If the voltage of the first node ND1 of the first delay unit (DU1) 110-1 is raised higher than the threshold voltage Vth2, the voltage of the first node ND1 of the first delay unit (DU1) 110-1 reaches the threshold voltage Vth1 of the first inverter 111. At this time, the first output signal O1 output from the first inverter 111 is dropped from the supply voltage VDD to the ground voltage VSS and the first bit AS[1] of the accumulation signal AS becomes '0'.

Meanwhile, since the first output signal O1 of the first delay unit (DU1) 110-1 serves as the first input signal I1 of the second delay unit (DU2) 110-2, when the first output signal O1 of the first delay unit (DU1) 110-1 becomes a gate voltage, for example, a half of the supply voltage VDD, the second PMOS transistor P2 of the second delay unit (DU2) 110-2 is turned on. Thus, the charges from the supply voltage VDD are charged in the first node ND1 of the second delay unit (DU2) 110-2 through the first and second PMOS transistors P1 and P2 so that the voltage of the first node ND1 is raised corresponding to the first gradient a1 ranging from the ground voltage VSS to the supply voltage VDD. As the voltage of the first node ND1 of the second delay unit (DU2) 110-2 reaches the threshold voltage Vth2 of the second inverter 112 during the rise transition, the second output signal O2 output from the second inverter 112 of the second delay unit (DU2) 110-2 is dropped from the supply voltage VDD to the ground voltage VSS. If the voltage of the first node ND1 of the second delay unit (DU2) 110-2 is more raised, the voltage of the first node ND1 of the second delay unit (DU2) 110-2 reaches the threshold voltage Vth1 of the first inverter 111. At this time, the first output signal O1 output from the first inverter 111 of the second delay unit (DU2) 110-2 is dropped from the supply voltage VDD to the ground voltage VSS and the second bit AS[2] of the accumulation signal AS becomes '0'.

The above process is repeated from the first delay unit (DU1) 110-1 to the fifth delay unit (DU5) 110-5, and the first to fifth bits of the accumulation signal AS sequentially become '0'.

As illustrated in FIG. 5, a time required to increase the voltage of the first node ND1 from the supply voltage VDD to the threshold voltage Vth1 of the first inverter 111 is a rise transition time tRI of the first node ND1, and a time required to drop the first output signal O1 from the supply voltage VDD to the half of the supply voltage VDD is a propagation delay time tINV1 of the first inverter 111. Thus, a time to transfer the first input signal I1 to the next delay unit through the first output signal O1 is a sum of the rise transition time tRI and the propagation delay time tINV1. That is, each of the first to seventh delay units 110-1, 110-2, 110-3, 110-4, 110-5, 110-6 and 110-7 transfers the first input signal I1 to the next delay unit by delaying the first input signal I1 for the time corresponding to the sum of the rise transition time tRI of the first node ND1 and the propagation delay time tINV1 of the first inverter 111.

Meanwhile, since the first output signal O1 of the fifth delay unit (DU5) 110-5 serves as the first input signal I1 of the sixth delay unit (DU6) 110-6, when the first output signal O1 of the fifth delay unit (DU5) 110-5 becomes a half of the supply voltage VDD, the second PMOS transistor P2 of the sixth delay unit (DU6) 110-6 is turned on. Thus, the charges from the supply voltage VDD are charged in the first node ND1 of the sixth delay unit (DU6) 110-6 through the first and second PMOS transistors P1 and P2 so that the voltage of the first node ND1 is raised from the ground voltage VSS corresponding to the first gradient a1. As the voltage of the first node ND1 of the sixth delay unit (DU6) 110-6 reaches the threshold voltage Vth2 of the second inverter 112 during the rise transition of the voltage in the first node ND1 of the sixth delay unit (DU6) 110-6, the second output signal O2 output from the second inverter 112 of the sixth delay unit (DU6) 110-6 is dropped from the supply voltage VDD to the ground voltage VSS. As illustrated in FIG. 5, as the voltage of the first node ND1 of the sixth delay unit (DU6) 110-6 is raised higher than the threshold voltage Vth2, the clock signal CLK is transited into the logic high level before the voltage reaches the threshold voltage Vth1 of the first inverter 111. Thus, the first output signal O1 of the sixth delay unit (DU6) 110-6 is maintained at the supply voltage VDD.

As a result, when the clock signal CLK is transited into the logic high level, the accumulation signal AS output from the duty cycle error accumulation circuit 100a is AS[1:7]= '0000011'.

If the clock signal CLK is transited into the logic high level, all first PMOS transistors P1 included in the first to seventh delay units 110-1, 110-2, 110-3, 110-4, 110-5, 110-6 and 110-7 are turned off so that the first node ND1 is electrically blocked from the supply voltage VDD. In addition, all first NMOS transistors P1 included in the first to seventh delay units 110-1, 110-2, 110-3, 110-4, 110-5, 110-6 and 110-7 are turned on.

Meanwhile, as described above, although the second output signal O2 of the first to sixth delay units 110-1, 110-2, 110-3, 110-4, 110-5 and 110-6 is dropped to the ground voltage VSS during the duration of the logic low level of the clock signal CLK, the second output signal O2 of the seventh delay unit 110-7 is maintained at the supply voltage VDD. In addition, the feedback unit 120a supplies the second output signal O2 of the seventh delay unit 110-7 as the second input signal I2 of the sixth delay unit (DU6) 110-6, so the second NMOS transistor N2 of the sixth delay unit (DU6) 110-6 is turned on. Thus, the charges in the first node 1 of the sixth delay unit (DU6) 110-6 are discharged to the ground voltage VSS through the first and second NMOS transistors N1 and N2, so the voltage of the first node ND1 of the sixth delay unit (DU6) 110-6 is dropped again to the ground voltage VSS.

At this time, as illustrated in FIG. 5, the voltage of the first node ND1 is dropped to the ground voltage VSS corresponding to a second gradient a2. As described above with reference to FIGS. 3 and 4, the aspect ratio (W/L) of the first and second NMOS transistors N1 and N2 is lower than the aspect ratio (W/L) of the first and second PMOS transistors P1 and P2. Thus, the second gradient a2 during the fall transition of the voltage in the first node ND1 for the duration of the logic high level of the clock signal CLK is smaller than the first gradient a1 during the rise transition of the voltage in the first node ND1 for the duration of the logic low level of the clock signal CLK.

In a fall transition, the voltage in the first node ND1 of the sixth delay unit (DU6) 110-6 reaches the threshold voltage Vth2 of the second inverter 112. At this time, the second output signal O2 output from the second inverter 112 of the sixth delay unit (DU6) 110-6 is raised from the ground voltage VSS to the supply voltage VDD.

Meanwhile, since the feedback unit 120a supplies the second output signal O2 of the sixth delay unit (DU6) 110-6 as the second input signal I3 of the fifth delay unit (DU5) 110-5, when the second output signal O2 of the sixth delay unit (DU6) 110-6 becomes a half of the supply voltage VDD, the second NMOS transistor N2 of the fifth delay unit (DU5) 110-5 is turned on. Thus, the charges in the first node ND1 of the fifth delay unit (DU5) 110-5 are discharged to the ground voltage VSS through the first and second NMOS transistors N1 and N2 so that the voltage of the first node ND1 of the fifth delay unit (DU5) 110-5 is dropped from the supply voltage VDD to the ground voltage VSS corresponding to the second gradient a2. When the voltage reaches the threshold voltage Vth1 of the first inverter 111 during the fall transition of the voltage in the first node ND1 of the fifth delay unit (DU5) 110-5, the first output signal O1 output from the first inverter 111 of the fifth delay unit (DU5) 110-5 is raised from the ground voltage VSS to the supply voltage VDD and the fifth bit AS[5] of the accumulation signal AS becomes '1'. If the voltage of the first node ND1 of the fifth delay unit (DU5) 110-5 is more dropped so the voltage reaches the second threshold voltage Vth2 of the second inverter 112, the second output signal O2 output from the second inverter 112 of the fifth delay unit (DU5) 110-5 is raised from the ground voltage VSS to the supply voltage VDD The above process is repeated from the fifth delay unit (DU5) 110-5 to the third delay unit (DU3) 110-3, and the fifth to third bits of the accumulation signal AS sequentially become '0'.

As illustrated in FIG. 5, a time required to drop the voltage of the first node ND1 from the supply voltage VDD to the threshold voltage Vth2 of the second inverter 112 is a fall transition time tFI of the first node ND1, and a time required to rise the second output signal O2 from the ground voltage VSS to the half of the supply voltage VDD is a propagation delay time tINV2 of the second inverter 112. Thus, a time to transfer the second input signal I2 to the previous delay unit through the second output signal O2 is a sum of the fall transition time tFI of the first node ND1 and the propagation delay time tINV2 of the second inverter 112. That is, each of the first to seventh delay units 110-1, 110-2, 110-3, 110-4, 110-5, 110-6 and 110-7 transfers the second input signal I2 to the previous delay unit by delaying the second input signal I2 for the time corresponding to the sum of the fall transition time tFI of the first node ND1 and the propagation delay time tINV2 of the second inverter 112.

Meanwhile, since the second output signal O2 of the third delay unit (DU3) 110-3 serves as the second input signal I2 of the second delay unit (DU2) 110-2, when the second output signal O2 of the third delay unit (DU3) 110-3 becomes a half of the supply voltage VDD, the second NMOS transistor N2 of the second delay unit (DU2) 110-2 is turned on. Thus, the charges in the first node ND1 of the second delay unit (DU2) 110-2 are discharged to the ground voltage VSS through the first and second NMOS transistors N1 and N2 so that the voltage of the first node ND1 of the second delay unit (DU2) 110-2 is dropped from the supply voltage VDD corresponding to the second gradient a2. As the voltage of the first node ND1 of the second delay unit (DU2) 110-2 reaches the threshold voltage Vth1 of the first inverter 111 during the fall transition of the voltage in the first node ND1 of the second delay unit (DU2) 110-2, the first output signal O1 output from the first inverter 111 of the second delay unit (DU2) 110-2 is raised from the ground voltage VSS to the supply voltage VDD. As illustrated in FIG. 5, as the voltage of the first node ND1 of the second delay unit (DU2) 110-2 is decreased lower than the threshold Vth1, the clock signal CLK is transited into the logic low level before the voltage reaches the threshold voltage Vth2 of the second inverter 112. Thus, the second output signal O2 of the second delay unit (DU2) 110-2 is maintained at the ground voltage VSS.

As a result, when the clock signal CLK is transited into the logic low level, the accumulation signal AS output from the duty cycle error accumulation circuit 100a is AS[1:7]='0111111'.

As described above, since the aspect ratio (W/L) of the first and second PMOS transistors P1 and P2 is higher than the aspect ratio (W/L) of the first and second NMOS transistors N1 and N2, the intensity (amount or level) of a current flowing from the supply voltage VDD to the first node ND1 when the first and second PMOS transistors P1 and P2 are turned on is higher than the intensity (amount or level) of a current flowing from the first node ND1 to the ground voltage VSS when the first and second NMOS transistors N1 and N2 are turned on. Therefore, the rise transition time tRI of the first node ND1 is shorter than the fall transition time tFI of the first node ND1, so the number of the delay units, in which the accumulation signal AS is transited for the duration of the logic low level of the clock signal CLK, is more than the number of the delay units, in which the accumulation signal AS is transited for the duration of the logic high level of the clock signal CLK, in the first to seventh delay units 110-1, 110-2, 110-3, 110-4, 110-5, 110-6 and 110-7.

Therefore, in the initial stage, the duty cycle error accumulation circuit 100a shown in FIG. 2 outputs the accumulation signal AS, in which all bits are '1', that is, AS[1:7]= '1111111'. However, after one period of the clock signal CLK has elapsed, the duty cycle error accumulation circuit 100a outputs the accumulation signal AS, in which the first bit AS[1] is '0' and remaining bits are '1', that is, AS[1:7]= '0111111'. If the third time tA, which is the length of the logic low level duration of the clock signal CLK, is longer than the fourth time tB, which is the length of the logic high level duration of the clock signal CLK, the number of bits that consecutively have the value of '0' is increased in the accumulation signal AS output from the duty cycle error accumulation circuit 100a after one period of the clock signal CLK has elapsed. In addition, if the duty cycle error accumulation circuit 100a accumulatively operates for a plurality of periods of the clock signal CLK, the number of bits that consecutively have the value of '0' is more increased in the accumulation signal AS output from the duty cycle error accumulation circuit 100a.

Hereinafter, the relation of the number of bits that consecutively have the value of '0' in the accumulation signal AS output from the duty cycle error accumulation circuit 100a with respect to the third time tA, which is the length of the logic low level duration and the fourth time tB, which is the length of the logic high level duration, will be described.

Referring to FIG. 5, the time for transferring the first input signal I1 to the next delay unit through the first output signal O1 is the sum of the rise transition time tRI of the first node ND1 and the propagation delay time tINV1 of the first inverter 111, the number of the delay units, in which the accumulation signal AS is transited from '1' to '0' in the logic low level duration of the clock signal CLK, can be obtained through following equation 1.

$$Nlow = tA/(tRI + tINV1)$$ [Equation 1]

However, in general, Nlow may not be an integer. The number of the delay units, in which the accumulation signal AS is transited from '1' to '0' in the logic low level duration of the clock signal CLK, may be a minimum integer equal to or higher than Nlow or a maximum integer equal to or less than Nlow depending on the intensity of the threshold voltage Vth1 of the first inverter 111.

For instance, in the case of the timing diagram illustrated in FIG. 5, Nlow is about 5.7, the accumulation signal AS output from the duty cycle error accumulation circuit 100a when the clock signal CLK is transited into the logic low level is AS[1:7]='1111111', and the accumulation signal AS output from the duty cycle error accumulation circuit 100a when the clock signal CLK is transited from the logic low level to the logic high level is AS[1:7]='0000011', so the number of delay units, in which the accumulation signal AS is transited from '1' to '0' in the logic low level duration of the clock signal CLK, is 5.

Meanwhile, referring to FIG. 5, since the time to transfer the second input signal I2 to the previous delay unit through the second output signal O2 is a sum of the fall transition time tFI of the first node ND1 and the propagation delay time tINV2 of the second inverter 112, the number of the delay units, in which the accumulation signal AS is transited from '0' to '1' in the logic high level duration of the clock signal CLK, can be obtained through following equation 2.

$$Nhigh = tB/(tFI + tINV2)$$ [Equation 2]

However, in general, Nhigh may not be an integer. Actually, the number of the delay units, in which the accumulation signal AS is transited from '0' to '1' in the logic high level duration of the clock signal CLK, may be a minimum integer equal to or higher than Nhigh or a maximum integer equal to or less than Nhigh depending on the intensity of the threshold voltage Vth1 of the first inverter 111.

For instance, in the case of the timing diagram illustrated in FIG. 5, Nhigh is about 4.4, the accumulation signal AS output from the duty cycle error accumulation circuit 100a when the clock signal CLK is transited into the logic high level is AS[1:7]='0000011', and the accumulation signal AS output from the duty cycle error accumulation circuit 100a when the clock signal CLK is transited from the logic high level to the logic low level is AS[1:7]='0111111', so the number of delay units, in which the accumulation signal AS is transited from '0' to '1' in the logic high level duration of the clock signal CLK, is 4.

Therefore, the number of bits that consecutively have '0' in the accumulation signal AS output from the duty cycle error accumulation circuit 100a after one period of the clock signal CLK has elapsed can be obtained through following equation 3.

$$Ndiff = Nlow - Nhigh \quad\quad\quad [\text{Equation 3}]$$
$$= (tA/(tRI + tINV1)) - (tB/(tFI + tINV2))$$

The rise transition time tRI of the first node ND1, the propagation delay time tINV1 of the first inverter 111, the fall transition time tFI of the first node ND1 and the propagation delay time tINV2 of the second inverter 112 may have eigenvalues determined depending on the characteristics of transistors and inverters included in the duty cycle error accumulation circuit 100a, so the duty cycle error accumulation circuit 100a can detect the duty cycle error of the clock signal CLK based on the number of bits that consecutively have the value of '0' in the accumulation signal AS.

As described above, in general, Nlow and Nhigh are not the integer, so an error of maximum 1 may occur between Ndiff and the number of bits that consecutively have the value of '0' in the accumulation signal AS output from the duty cycle error accumulation circuit 100a after one period of the clock signal CLK has elapsed.

For instance, in the case of the timing view shown in FIG. 5, Nlow is about 5.7 and Nhigh is about 4.4, so Ndiff is 1.3 and the accumulation signal AS output from the duty cycle error accumulation circuit 100a after one period of the clock signal CLK has elapsed is AS[1:7]='0111111'. Thus, the number of bits that consecutively have the value of '0' in the accumulation signal AS is 1. Thus, there is an error of 0.3 between Ndiff and the number of bits that consecutively have the value of '0' in the accumulation signal AS output from the duty cycle error accumulation circuit 100a after one period of the clock signal CLK has elapsed.

The duty cycle error accumulation circuit 100a accumulatively operates for a plurality of periods of the clock signal CLK, so the duty cycle error accumulation circuit 100a can more precisely detect the duty cycle error of the clock signal CLK.

That is, the number of bits that consecutively have the value of '0' in the accumulation signal AS output from the duty cycle error accumulation circuit 100a after m periods of the clock signal CLK has elapsed (m is an integer of 2 or more) can be obtained through following equation 4.

$$Ndiff = (Nlow - Nhigh) * m \quad\quad\quad [\text{Equation 4}]$$
$$= ((tA/(tRI + tINV1)) - (tB/(tFI + tINV2))) * m$$

Referring to the following table, in any cases in which Ndiff has the value in the range of 1.1 to 1.9 after one period of the clock signal CLK has elapsed, the number of bits that consecutively have the value of '0' in the accumulation signal AS output from the duty cycle error accumulation circuit 100a is 1. However, if the duty cycle error accumulation circuit 100a accumulatively operates for two periods of the clock signal CLK, Ndiff has the value in the range of 2.2 to 3.8, and the number of bits that consecutively have the value of '0' in the accumulation signal AS output from the duty cycle error accumulation circuit 100a is 2 or 3. In the same manner, if the duty cycle error accumulation circuit 100a accumulatively operates for three periods of the clock signal CLK, Ndiff has the value in the range of 3.3 to 5.7, and the number of bits that consecutively have the value of '0' in the accumulation signal AS output from the duty cycle error accumulation circuit 100a is 3, 4 or 5. Further, if the duty cycle error accumulation circuit 100a accumulatively operates for four periods of the clock signal CLK, Ndiff has the value in the range of 4.4 to 7.6, and the number of bits that consecutively have the value of '0' in the accumulation signal AS output from the duty cycle error accumulation circuit 100a is 4, 5, 6 or 7.

| | | | | | | | | | |
|---|---|---|---|---|---|---|---|---|---|
| Ndiff after 1 cycle | 1.1 | 1.2 | 1.3 | 1.4 | 1.5 | 1.6 | 1.7 | 1.8 | 1.9 |
| Number of '0' in AS | 1 | 1 | 1 | 1 | 1 | 1 | 1 | 1 | 1 |
| Ndiff after 2 cycle | 2.2 | 2.4 | 2.6 | 2.8 | 3 | 3.2 | 3.4 | 3.6 | 3.8 |
| Number of '0' in AS | 2 | 2 | 2 | 2 | 3 | 3 | 3 | 3 | 3 |
| Ndiff after 3 cycle | 3.3 | 3.6 | 3.9 | 4.2 | 4.5 | 4.8 | 5.1 | 5.4 | 5.7 |
| Number of '0' in AS | 3 | 3 | 3 | 4 | 4 | 4 | 5 | 5 | 5 |
| Ndiff after 4 cycle | 4.4 | 4.8 | 5.2 | 5.6 | 6 | 6.4 | 6.8 | 7.2 | 7.6 |
| Number of '0' in AS | 4 | 4 | 5 | 5 | 6 | 6 | 6 | 7 | 7 |

That is, when the duty cycle error accumulation circuit 100a accumulatively operates for the m periods of the clock signal CLK, an error between Ndiff and the number of bits that consecutively have the value of '0' in the accumulation signal AS output from the duty cycle error accumulation circuit 100a after one period of the clock signal CLK has elapsed may be reduced proportionally to m.

Thus, as the number of the periods of the clock signals CLK for the accumulative operation of the duty cycle error accumulation circuit 100a is increased, the duty cycle error accumulation circuit 100a can more precisely detect the duty cycle error of the clock signal CLK.

Figure 6:
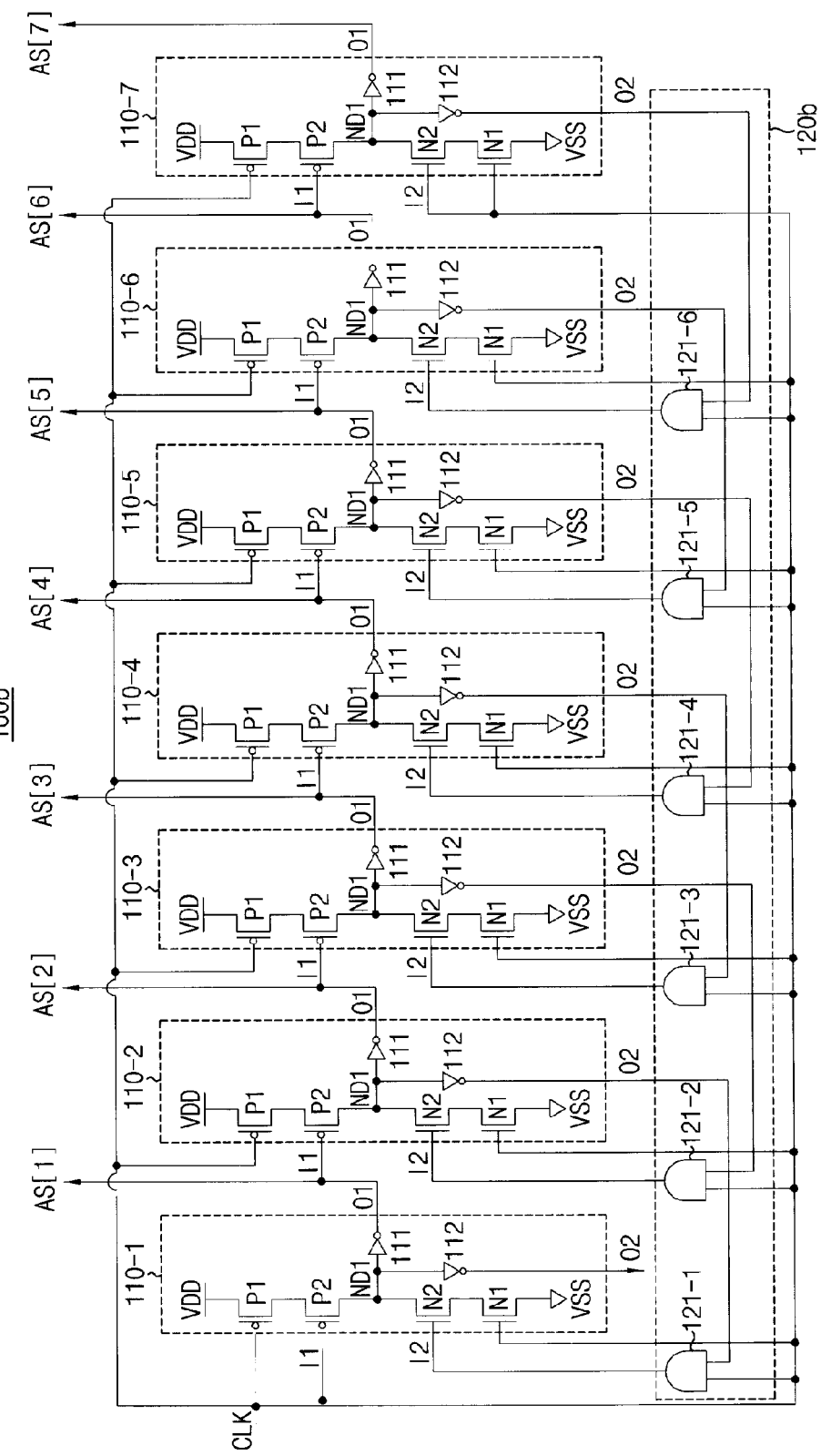
FIGS. 6 and 7 are circuit diagrams illustrating the duty cycle error accumulation circuit illustrated in FIG. 1.

FIG. 6 is a circuit diagram illustrating a duty cycle error accumulation circuit 100b according to an embodiment of the present general inventive concept. The duty cycle error accumulation circuit 100b of FIG. 6 may be the circuit 100 of FIG. 1.

Referring to FIG. 6, the duty cycle error accumulation circuit 100b may include first to seventh delay units 110-1, 110-2, 110-3, 110-4, 110-5, 110-6 and 110-7 and a feedback unit 120b.

FIG. 6 illustrates the case in which n is 7, but n may be lower or higher than 7 depending on example embodiments.

The first to seventh delay units 110-1, 110-2, 110-3, 110-4, 110-5, 110-6 and 110-7 included in the duty cycle error accumulation circuit 100b shown in FIG. 6 are identical to the first to seventh delay units 110-1, 110-2, 110-3, 110-4, 110-5, 110-6 and 110-7 included in the duty cycle error accumulation circuit 100a shown in FIG. 2, so detailed description thereof will be omitted.

The feedback unit 120b may include first to sixth AND gates 121-1, 121-2, 121-3, 121-4, 121-5 and 121-6. A $k^{th}$ AND gate may supply a result of an AND operation on the second output signal O2 of the $(k+1)^{th}$ delay unit and the clock signal CLK to a $k^{th}$ delay unit as the second input signal I2.

Thus, the second NMOS transistors N2 included in the first to seventh delay units 110-1, 110-2, 110-3, 110-4, 110-5, 110-6 and 110-7 are always turned off in the logic low level duration of the clock signal CLK, so the duty cycle error accumulation circuit 100b illustrated in FIG. 6 can more effectively block the leakage of charges from the first node ND1 to the ground voltage VSS in the logic low level duration of the clock signal CLK.

The operation of the duty cycle error accumulation circuit 100b illustrated in FIG. 6 is identical to the operation of the duty cycle error accumulation circuit 100a illustrated in FIG. 2, which has been described with reference to FIGS. 2 to 5, so detailed description about the operation of the duty cycle error accumulation circuit 100b will be omitted.

Figure 7:
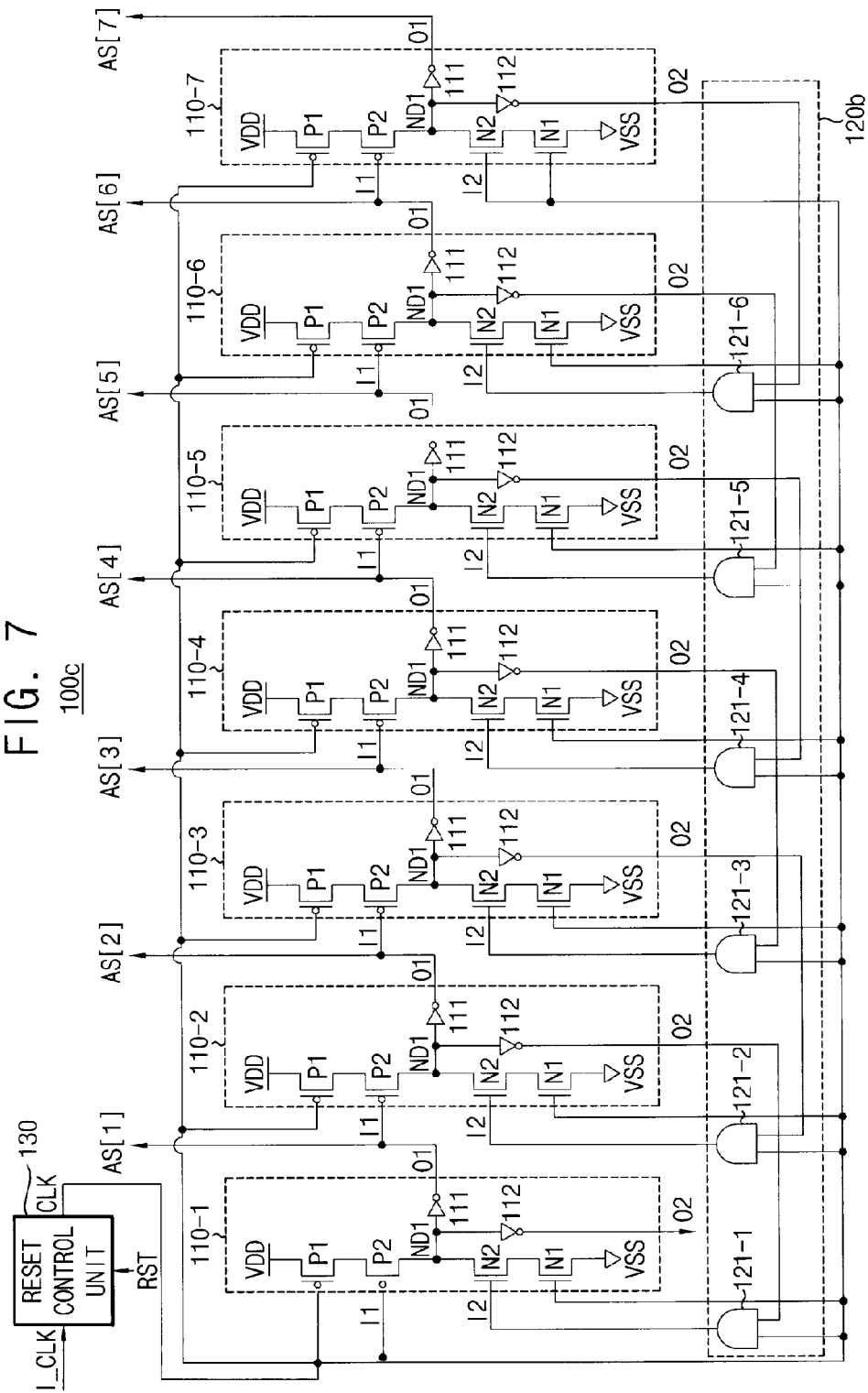

FIG. 7 is a circuit diagram illustrating a duty cycle error accumulation circuit 100c according to an embodiment of the present general inventive concept. The duty cycle error accumulation circuit 100c of FIG. 7 may be the circuit 100 of FIG. 1.

Referring to FIG. 7, the duty cycle error accumulation circuit 100c may include first to seventh delay units 110-1, 110-2, 110-3, 110-4, 110-5, 110-6 and 110-7, a feedback unit 120b and a reset control unit 130.

FIG. 7 illustrates a case in which n is 7, however, the present general inventive concept is not limited thereto. It is possible that n may be lower or higher than 7 depending on exemplary embodiments of the present general inventive concept.

The first to seventh delay units 110-1, 110-2, 110-3, 110-4, 110-5, 110-6 and 110-7 included in the duty cycle error accumulation circuit 100c and the feedback unit 120b of FIG. 7 may be identical to the first to seventh delay units 110-1, 110-2, 110-3, 110-4, 110-5, 110-6 and 110-7 included in the duty cycle error accumulation circuit 100a and the feedback unit 120b of FIG. 6, so detailed description thereof will be omitted.

A reset control unit 130 may receive a reset signal RST and an input clock signal I_CLK. When the reset signal RST is activated, the reset control unit 130 may supply a signal maintained at a first logic level to the first to seventh delay units 110-1, 110-2, 110-3, 110-4, 110-5, 110-6 and 110-7 and the feedback unit 120b as the clock signal CLK. In one example embodiment, the first logic level may be the logic high level. In this case, as described above with reference to FIG. 5, the voltage of the first node ND1 included in the first to seventh delay units 110-1, 110-2, 110-3, 110-4, 110-5, 110-6 and 110-7 is reset to the ground voltage VSS, and first and second output signals O1 and O2 of the first to seventh delay units 110-1, 110-2, 110-3, 110-4, 110-5, 110-6 and 110-7 are reset to the supply voltage VDD.

In addition, when the reset signal RST is inactivated, the reset control unit 130 may supply the clock signal CLK to the first to seventh delay units 110-1, 110-2, 110-3, 110-4, 110-5, 110-6 and 110-7 and the feedback unit 120b by bypassing the input clock signal I_CLK from the time point at which the input clock signal I_CLK is transited into a second logic level. In one example embodiment, the second logic level may be the logic low level. In this case, the operation of the duty cycle error accumulation circuit 100c is identical to the operation of the duty cycle error accumulation circuit 100a shown in FIG. 2, which has been described with reference to FIGS. 2 to 5, so detailed description about the operation of the duty cycle error accumulation circuit 100c will be omitted.

Figure 8:
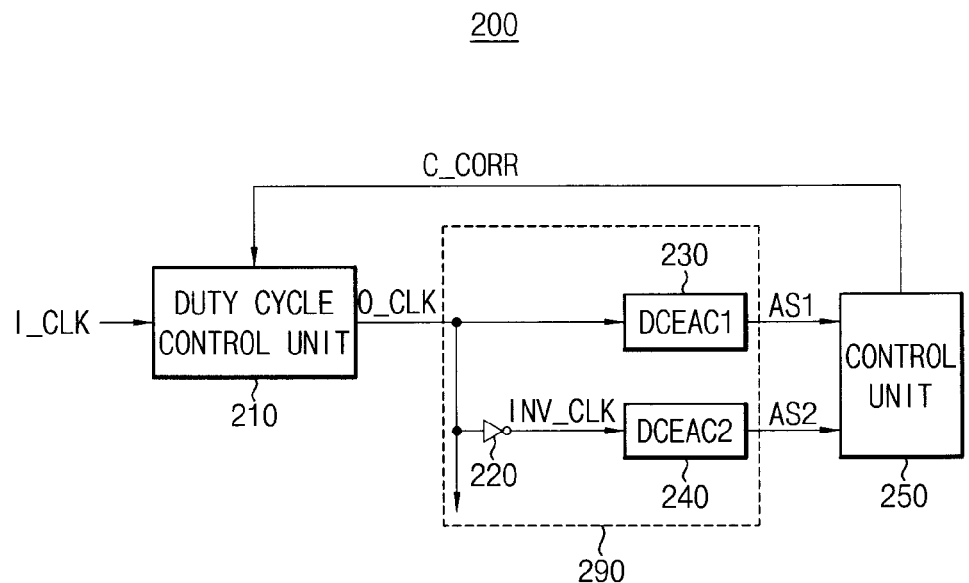
FIG. 8 is a block diagram illustrating a duty cycle correction circuit according to an exemplary embodiment of the present general inventive concept.

FIG. 8 is a block diagram illustrating a duty cycle correction circuit 200 according to an exemplary embodiment of the present general inventive concept.

Referring to FIG. 8, the duty cycle correction circuit 200 includes a duty cycle control unit 210, an inverter 220, a first duty cycle error accumulation circuit (DCEAC1) 230, a second duty cycle error accumulation circuit (DCEAC2) 240 and a control unit 250.

The duty cycle control unit 210 receives an input clock signal I_CLK to generate an output clock signal O_CLK. If a duty cycle correction signal C_CORR is not received from the control unit 250, the duty cycle control unit 210 generates the output clock signal O_CLK by bypassing the input clock signal I_CLK. If the duty cycle correction signal C_CORR is received from the control unit 250, the duty cycle control unit 210 generates the output clock signal O_CLK by correcting (controlling or adjusting) the duty cycle of the input clock signal I_CLK based on the duty cycle correction signal C_CORR.

In the initial operation of the duty cycle correction circuit 200, the control unit 250 may not output the duty cycle correction signal C_CORR. Thus, the duty cycle control unit 210 generates the output clock signal O_CLK by bypassing the input clock signal I_CLK in the initial operation of the duty cycle correction circuit 200.

Meanwhile, the duty cycle control unit 210 can be implemented in various forms to control the duty cycle of the clock signal CLK.

The inverter 220 generates an inverse clock signal INV_CLK by inversing the output clock signal O_CLK supplied from the duty cycle control unit 210.

The first duty cycle error accumulation circuit 230 receives the output clock signal O_CLK from the duty cycle control unit 210. The first duty cycle error accumulation circuit 230 generates a first accumulation signal AS1 for the m periods (m is an integer of 2 or more) based on the accumulation length of the logic high level duration of the output clock signal O_CLK and the accumulation length of the logic low level duration of the output clock signal O_CLK.

The second duty cycle error accumulation circuit 240 receives the inverse clock signal INV_CLK from the inverter 220. The second duty cycle error accumulation circuit 240 generates a second accumulation signal AS2 for the m periods based on the accumulation length of the logic high level duration of the inverse clock signal INV_CLK and the accumulation length of the logic low level duration of the inverse clock signal INV_CLK.

In the exemplary embodiment, the first and second duty cycle error accumulation circuits 230 and 240 can be prepared in the form of the duty cycle error accumulation circuit 100 of FIG. 1. The first and second duty cycle error accumulation circuits 230 and 240 and the inverter 220 may form a duty cycle error accumulating unit 290 to generate the first and second accumulation signal AS1 and AS2 in response to the clock signal O_CLK.

Thus, as an accumulation length of the logic high level duration of the output clock signal O_CLK becomes shorter and an accumulation length of the logic low level duration of the output clock signal O_CLK becomes longer for the m periods, the number of the bits that consecutively have the value of '0' in the first accumulation signal AS1 generated from the first duty cycle error accumulation circuit 230 may be increased.

In addition, as the accumulation length of the logic high level duration of the inverse clock signal INV_CLK becomes short and the accumulation length of the logic low level duration of the inverse clock signal INV_CLK becomes long for the m periods, the number of the bits that consecutively have the value of '0' in the second accumulation signal AS2 generated from the second duty cycle error accumulation circuit 240 may be increased.

Various examples and operation of the duty cycle error accumulation circuit 100 have been described in detail with reference to FIGS. 1 to 7, so detailed description about the first and second duty cycle error accumulation circuits 230 and 240 will be omitted.

The control unit 250 generates the duty cycle correction signal C_CORR by comparing the first and second accumulation signals AS1 and AS2 with each other and supplies the duty cycle correction signal C_CORR to the duty cycle control unit 210.

For instance, the control unit 250 may generate the duty cycle correction signal C_CORR by comparing the number of bits that consecutively have the value of '0' in the first accumulation signal AS1 with the number of bits that consecutively have the value of '0' in the second accumulation signal AS2.

Meanwhile, if the first and second duty cycle error accumulation circuits 230 and 240 are prepared in the form of as the duty cycle error accumulation circuit 100c shown in FIG. 7, the reset signal RST received in the reset control unit 130 may be supplied from the control unit 250.

Figure 9:
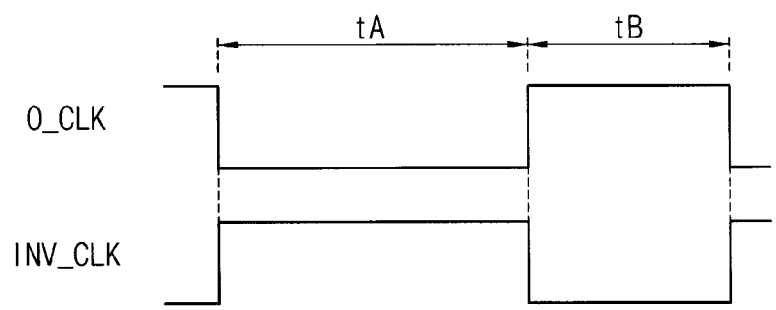
FIG. 9 is a view illustrating an operation of the duty cycle correction circuit of FIG. 8.

FIG. 9 is a view illustrating an operation of the duty cycle correction circuit 200 of FIG. 8.

Hereinafter, the operation of the duty cycle correction circuit 200 of FIG. 8 will be described with reference to FIGS. 1 to 9.

As described above, since the control unit 250 may not output the duty cycle correction signal C_CORR in the initial operation of the duty cycle correction circuit 200, the duty cycle control unit 210 generates the output clock signal O_CLK by bypassing the input clock signal I_CLK.

As shown in FIG. 9, the output clock signal O_CLK output from the duty cycle control unit 210 in the initial operation of the duty cycle correction circuit 200 has the duty cycle error. That is, the length of the logic low level duration in one period of the output clock signal O_CLK is the third time tA, and the length of the logic high level duration in one period of the output clock signal O_CLK is the fourth time tB shorter than the third time tA. Thus, the length of the logic low level duration in one period of the inverse clock signal INV_CLK output from the inverter 220 is the fourth time tB and the length of the logic high level duration in one period of the inverse clock signal INV_CLK is the third time tA.

Since the first duty cycle error accumulation circuit 230 receives the output clock signal O_CLK and the second duty cycle error accumulation circuit 240 receives the inverse clock signal INV_CLK, referring to equations 1 to 4, the number of bits that consecutively have the value of '0' in the first accumulation signal AS1 output from the first duty cycle error accumulation circuit 230 after the m periods of the output clock signal O_CLK may be expressed as following equation 5, and the number of bits that consecutively have the value of '0' in the second accumulation signal AS2 output from the second duty cycle error accumulation circuit 240 after the m periods of the inverse clock signal INV_CLK may be expressed as following equation 6.

$$Ndiff1=((tA/(tRI+tINV1))-(tB/(tFI+tINV2)))*m \quad \text{[Equation 5]}$$

$$Ndiff2=((tB/(tRI+tINV1))-(tA/(tFI+tINV2)))*m \quad \text{[Equation 6]}$$

Thus, a difference between the number of bits that consecutively have the value of '0' in the first accumulation signal AS1 and the number of bits that consecutively have the value of '0' in the second accumulation signal AS2 can be expressed as following equation 7.

$$Ndiff1-Ndiff2=(tA-tB)*(1/(tRI+tINV1)+1/(tFI+tINV2))*m \quad \text{[Equation 7]}$$

If the third time tA representing the length of the logic low level duration in one period of the output clock signal O_CLK is longer than the fourth time tB representing the length of the logic high level duration in one period of the output clock signal O_CLK, the number of bits that consecutively have the value of '0' in the first accumulation signal AS1 is larger than the number of bits that consecutively have the value of '0' in the second accumulation signal AS2. In addition, if the third time tA is shorter than the fourth time tB, the number of bits that consecutively have the value of '0' in the second accumulation signal AS2 is larger than the number of bits that consecutively have the value of '0' in the first accumulation signal AS1.

Therefore, when the number of bits that consecutively have the value of '0' in the first accumulation signal AS1 is larger than the number of bits that consecutively have the value of '0' in the second accumulation signal AS2, the control unit 250 controls the duty cycle control unit 210 through the duty cycle correction signal C_CORR to reduce the width of the logic low level of the input clock signal I_CLK. In addition, when the number of bits that consecutively have the value of '0' in the second accumulation signal AS2 is larger than the number of bits that consecutively have the value of '0' in the first accumulation signal AS1, the control unit 250 controls the duty cycle control unit 210 through the duty cycle correction signal C_CORR to increase the width of the logic low level of the input clock signal I_CLK.

The control unit 250 determines a duty cycle error of the output clock signal O_CLK (that is, tA-tB) based on the difference between the number of bits that consecutively have the value of '0' in the first accumulation signal AS1 and the number of bits that consecutively have the value of '0' in the second accumulation signal AS2 and generates the duty cycle correction signal C_CORR based on the duty cycle error.

Referring to equation 7, if the number of bits that consecutively have the value of '0' in the first accumulation signal AS1 is larger than the number of bits that consecutively have the value of '0' in the second accumulation signal AS2 by z (z is a positive integer), the duty cycle error of the output clock signal O_CLK (that is, tA-tB) can be expressed as following equation 8.

$$(tA-tB)=z/((1/(tRI+tINV1)+1/(tFI+tINV2))*m) \quad \text{[Equation 8]}$$

The rise transition time tRI of the first node ND1, the propagation delay time tINV1 of the first inverter 111, the fall transition time tFI of the first node ND1 and the propagation delay time tINV2 of the second inverter 112, which are included in the first and second duty cycle error accumulation circuits 230 and 240, have the eigenvalues determined depending on the characteristics of transistors and inverters included in the first and second duty cycle error accumulation circuits 230 and 240. Thus, the duty cycle error of the output clock signal O_CLK (that is, tA-tB) can be determined based on the difference (that is, z) between the number of bits that consecutively have the value of '0' in the first accumulation signal AS1 and the number of bits that consecutively have the value of '0' in the second accumulation signal AS2 and the number of the periods (that is, m) of the clock signal for the accumulative operation of the first and second duty cycle error accumulation circuits 230 and 240, and the duty cycle correction signal C_CORR can be generated based on the duty cycle error to supply the duty cycle correction signal C_CORR to the duty cycle control unit 210.

The duty cycle control unit 210 generates the output clock signal O_CLK by correcting the duty cycle of the input clock signal I_CLK based on the duty cycle correction signal C_CORR.

The above operation may repeat until the number of bits that consecutively have the value of '0' in the first accumulation signal AS1 matches with the number of bits that consecutively have the value of '0' in the second accumulation signal AS2. If the number of bits that consecutively have the value of '0' in the first accumulation signal AS1 matches with the number of bits that consecutively have the value of '0' in the second accumulation signal AS2, the duty cycle control unit 210 generates the output clock signal O_CLK having the length of the logic low level duration equal to the length of the logic high level duration.

Meanwhile, referring to equation 8, as the number of the periods (that is, m) of the clock signals for the accumulative operation of the first and second duty cycle error accumulation circuits 230 and 240 is increased, the duty cycle correction circuit 200 can more precisely detect the duty cycle error.

Figure 10:
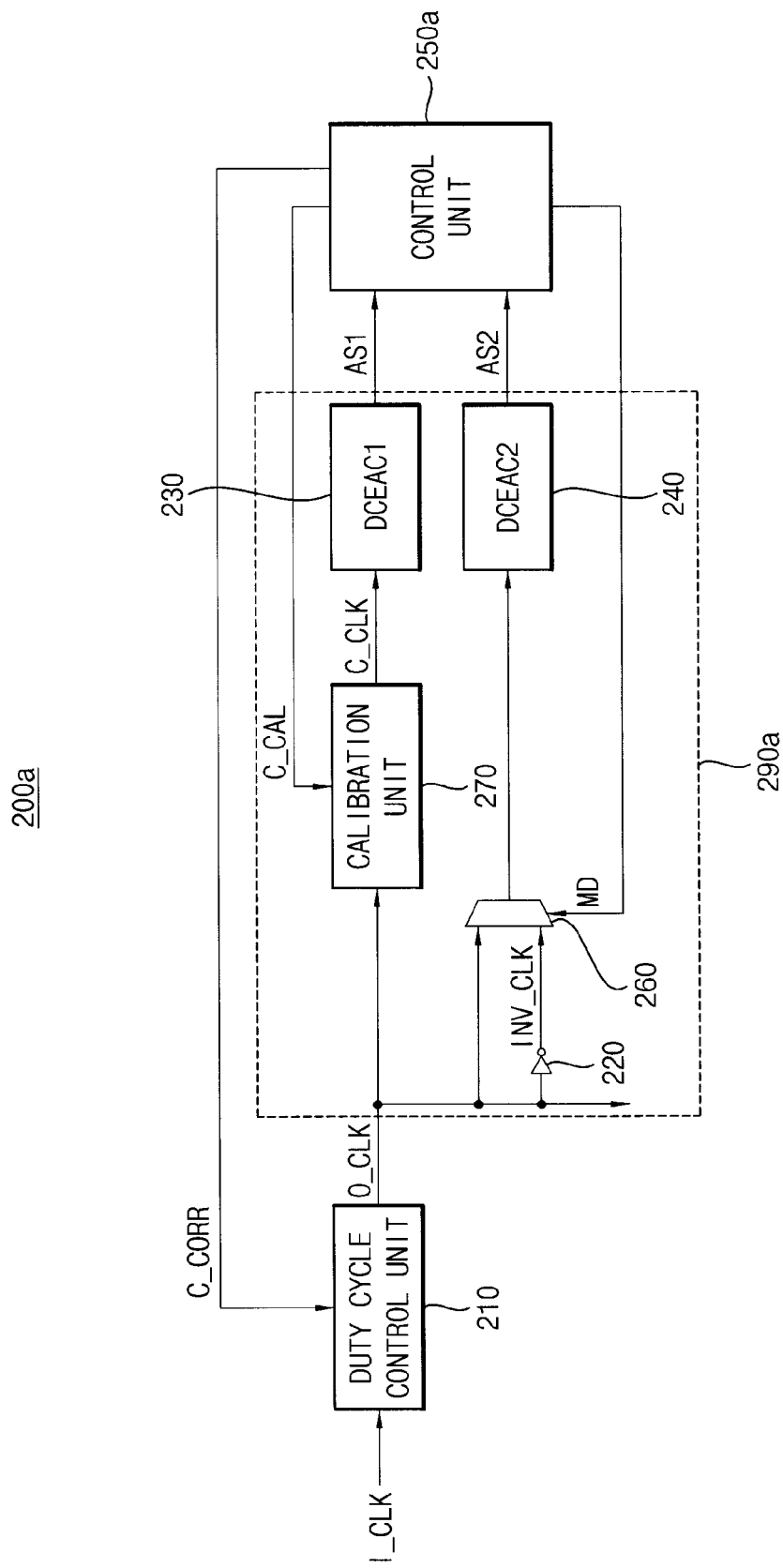
FIGS. 10 and 11 are block diagrams illustrating duty cycle correction circuits according to an exemplary embodiment of the present general inventive concept.

FIG. 10 is a block diagram illustrating a duty cycle correction circuit 200a according to an exemplary embodiment of the present general inventive concept.

Referring to FIG. 10, the duty cycle correction circuit 200a includes a duty cycle control unit 210, an inverter 220, a first duty cycle error accumulation circuit (DCEAC1) 230, a second duty cycle error accumulation circuit (DCEAC2) 240, a control unit 250a, a multiplexer 260 and a calibration unit 270.

The duty cycle control unit 210, the inverter 220, the first duty cycle error accumulation circuit (DCEAC1) 230 and the second duty cycle error accumulation circuit (DCEAC2) 240 included in the duty cycle correction circuit 200a of FIG. 10 are identical to the duty cycle control unit 210, the inverter 220, the first duty cycle error accumulation circuit (DCEAC1) 230 and the second duty cycle error accumulation circuit (DCEAC2) 240 included in the duty cycle correction circuit 200 of FIG. 8, so detailed description thereof will be omitted.

As described above with reference to FIGS. 8 and 9, the rise transition time tRI of the first node ND1, the propagation delay time tINV1 of the first inverter 111, the fall transition time tFI of the first node ND1 and the propagation delay time tINV2 of the second inverter 112, which are included in the first and second duty cycle error accumulation circuits 230 and 240, have the eigenvalues determined depending on the characteristics of transistors and inverters included in the first and second duty cycle error accumulation circuits 230 and 240.

However, parameters of the transistors and the inverters included in the first duty cycle error accumulation circuit 230 may not be the same as parameters of the transistors and the inverters included in the second duty cycle error accumulation circuit 240. Thus, the rise transition time tRI of the first node ND1, the propagation delay time tINV1 of the first inverter 111, the fall transition time tFI of the first node ND1 and the propagation delay time tINV2 of the second inverter 112 included in the first duty cycle error accumulation circuit 230 may not be the same the rise transition time tRI of the first node ND1, the propagation delay time tINV1 of the first inverter 111, the fall transition time tFI of the first node ND1 and the propagation delay time tINV2 of the second inverter 112 included in the second duty cycle error accumulation circuit 240, respectively.

The duty cycle correction circuit 200a may further include the multiplexer 260 and the calibration unit 270 in order to correct the above mismatch.

The multiplexer 260 receives the output clock signal O_CLK from the duty cycle control unit 210 and the inverse clock signal INV_CLK from the inverter 220. When a mode signal MD has a first logic level, the multiplexer 260 supplies the output clock signal O_CLK to the second duty cycle error accumulation circuit 240. When the mode signal MD has the second logic level, the multiplexer 260 supplies the inverse clock signal INV_CLK to a second duty cycle error accumulation circuit 240.

When a calibration signal C_CAL is not received from the control unit 250a, the calibration unit 270 supplies a corrected clock signal C_CLK to the first duty cycle error accumulation circuit 230 by bypassing the output clock signal O_CLK. If the calibration signal C_CAL is received from the control unit 250a, the calibration unit 270 supplies the corrected clock signal C_CLK to the first duty cycle error accumulation circuit 230 by correcting the duty cycle of the output clock signal O_CLK based on the calibration signal C_CAL.

Meanwhile, the calibration unit 270 can be implemented in various forms to control the duty cycle of the clock signal.

In the initial operation of the duty cycle correction circuit 200a, the control unit 250a is operated in a first mode. In the first mode, the control unit 250a supplies the mode signal MD having the first logic level to the multiplexer 260. Thus, the multiplexer 260 supplies the output clock signal O_CLK to the second duty cycle error accumulation circuit 240.

In the initial operation of the duty cycle correction circuit 200a, the control unit 250a may not output the calibration signal C_CAL. Therefore, the calibration unit 270 supplies the corrected clock signal C_CLK to the first duty cycle error accumulation circuit 230 by bypassing the output clock signal O_CLK in the initial operation of the duty cycle correction circuit 200a.

Thus, the first and second duty cycle error accumulation circuits 230 and 240 can receive the same output clock signal O_CLK. If the rise transition time tRI of the first node ND1, the propagation delay time tINV1 of the first inverter 111, the fall transition time tFI of the first node ND1 and the propagation delay time tINV2 of the second inverter 112 included in the first duty cycle error accumulation circuit 230 may be same as the rise transition time tRI of the first node ND1, the propagation delay time tINV1 of the first inverter 111, the fall transition time tFI of the first node ND1 and the propagation delay time tINV2 of the second inverter 112 included in the second duty cycle error accumulation circuit 240, respectively, the number of bits that consecutively have the value of '0' in the first accumulation signal AS1 may be equal to the number of bits that consecutively have the value of '0' in the second accumulation signal AS2.

However, as described above, the rise transition time tRI of the first node ND1, the propagation delay time tINV1 of the first inverter 111, the fall transition time tFI of the first node ND1 and the propagation delay time tINV2 of the second inverter 112 included in the first duty cycle error accumulation circuit 230 may not be same as the rise transition time tRI of the first node ND1, the propagation delay time tINV1 of the first inverter 111, the fall transition time tFI of the first node ND1 and the propagation delay time tINV2 of the second inverter 112 included in the second duty cycle error accumulation circuit 240, respectively, so the number of bits that consecutively have the value of '0' in the first accumulation signal AS1 may not be equal to the number of bits that consecutively have the value of '0' in the second accumulation signal AS2.

Accordingly, if the number of bits that consecutively have the value of '0' in the first accumulation signal AS1 is larger than the number of bits that consecutively have the value of '0' in the second accumulation signal AS2 in the first mode, the control unit 250a controls the calibration unit 270 through the calibration signal C_CAL to reduce the width of the logic low level of the output clock signal O_CLK. In addition, if the number of bits that consecutively have the value of '0' in the second accumulation signal AS2 is larger than the number of bits that consecutively have the value of '0' in the first accumulation signal AS1 in the first mode, the control unit 250a controls the calibration unit 270 through the calibration signal C_CAL to increase the width of the logic low level of the output clock signal O_CLK.

That is, the control unit 250a can compensate for the difference in parameters of the transistors and the inverters included in the first and second duty cycle error accumulation circuits 230 and 240 by controlling the duty cycle of the output clock signal O_CLK supplied to the first duty cycle error accumulation circuit 230.

Meanwhile, if the number of bits that consecutively have the value of '0' in the first accumulation signal AS1 is equal to the number of bits that consecutively have the value of '0' in the second accumulation signal AS2, the operation of the control unit 250a is switched into a second mode. In the second mode, the control unit 250a supplies the mode signal MD having the second logic level to the multiplexer 260.

Therefore, the multiplexer 260 supplies the inverse clock signal INV_CLK to the second duty cycle error accumulation circuit 240 in the second mode. In the second mode, the control unit 250a generates the duty cycle correction signal C_CORR by comparing the number of bits that consecutively have the value of '0' in the first accumulation signal AS1 with the number of bits that consecutively have the value of '0' in the second accumulation signal AS2 and supplies the duty cycle correction signal C_CORR to the duty cycle control unit 210. Thus, the duty cycle control unit 210 can generate the output clock signal O_CLK, in which the length of the logic low level duration may be same as (or may correspond to) the length of the logic high level duration, by correcting the duty cycle of the input clock signal I_CLK based on the duty cycle correction signal C_CORR.

The operation of the duty cycle correction circuit 200a in the second mode is identical to the operation of the duty cycle correction circuit 200 shown in FIG. 8. Since the operation of the duty cycle correction circuit 200 shown in FIG. 8 has been described in detail with reference to FIGS. 8 and 9, detailed description about the operation of the duty cycle correction circuit 200a will be omitted. The first duty cycle error accumulation circuit (DCEAC1) 230, the second duty cycle error accumulation circuit (DCEAC2) 240, the inverter 220, the multiplexer 260 and the calibration unit 270 may be referred to as a duty cycle error accumulating unit 290a to generate the first and second accumulation signal AS1 and AS2 in response to the clock signal O_CLK.

Figure 11:
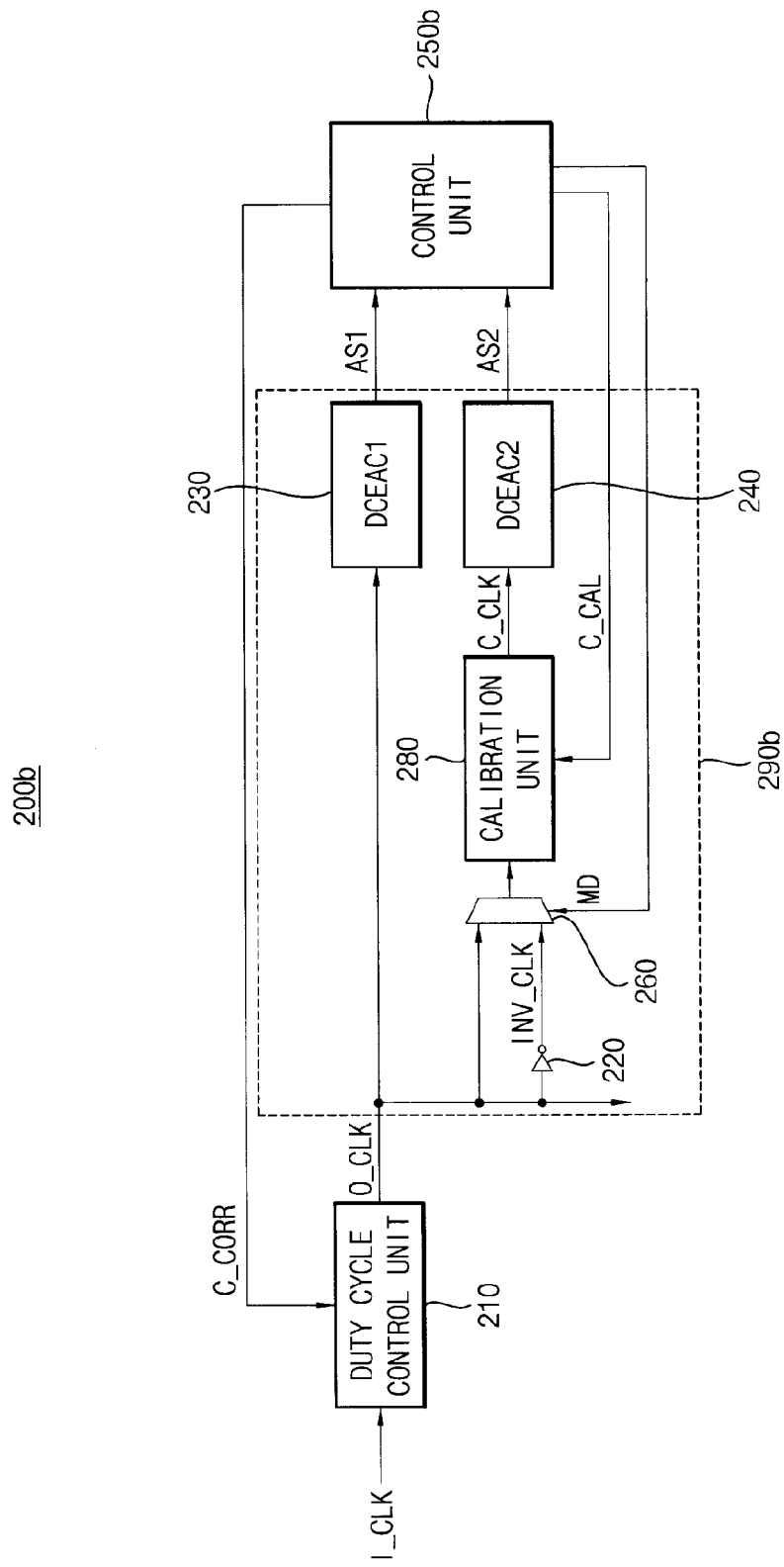

FIG. 11 is a block diagram illustrating a duty cycle correction circuit 200b according to an exemplary embodiment of the present general inventive concept.

Referring to FIG. 11, the duty cycle correction circuit 200b includes a duty cycle control unit 210, an inverter 220, a first duty cycle error accumulation circuit (DCEAC1) 230, a second duty cycle error accumulation circuit (DCEAC2) 240, a control unit 250b, a multiplexer 260 and a calibration unit 280.

The duty cycle control unit 210, the inverter 220, the first duty cycle error accumulation circuit (DCEAC1) 230 and the second duty cycle error accumulation circuit (DCEAC2) 240 included in the duty cycle correction circuit 200b of FIG. 11 are identical to the duty cycle control unit 210, the inverter 220, the first duty cycle error accumulation circuit (DCEAC1) 230 and the second duty cycle error accumulation circuit (DCEAC2) 240 included in the duty cycle correction circuit 200 of FIG. 8, so detailed description thereof will be omitted.

As described above with reference to FIGS. 8 and 9, the rise transition time tRI of the first node ND1, the propagation delay time tINV1 of the first inverter 111, the fall transition time tFI of the first node ND1 and the propagation delay time tINV2 of the second inverter 112, which are included in the first and second duty cycle error accumulation circuits 230 and 240, have the eigenvalues determined depending on the characteristics of transistors and inverters included in the first and second duty cycle error accumulation circuits 230 and 240.

However, parameters of the transistors and the inverters included in the first duty cycle error accumulation circuit 230 may not be same as parameters of the transistors and the inverters included in the second duty cycle error accumulation circuit 240. Thus, the rise transition time tRI of the first node ND1, the propagation delay time tINV1 of the first inverter 111, the fall transition time tFI of the first node ND1 and the propagation delay time tINV2 of the second inverter 112 included in the first duty cycle error accumulation circuit 230 may not be same as (or correspond to) the rise transition time tRI of the first node ND1, the propagation delay time tINV1 of the first inverter 111, the fall transition time tFI of the first node ND1 and the propagation delay time tINV2 of the second inverter 112 included in the second duty cycle error accumulation circuit 240, respectively.

The duty cycle correction circuit 200b may further include the multiplexer 260 and the calibration unit 280 in order to correct the above mismatch.

The multiplexer 260 receives the output clock signal O_CLK from the duty cycle control unit 210 and the inverse clock signal INV_CLK from the inverter 220. When the mode signal MD has the first logic level, the multiplexer 260 supplies the output clock signal O_CLK to the calibration unit 280. When the mode signal MD has the second logic level, the multiplexer 260 supplies the inverse clock signal INV_CLK to the calibration unit 280.

When the calibration signal C_CAL is not received from the control unit 250b, the calibration unit 280 supplies the corrected clock signal C_CLK to the second duty cycle error accumulation circuit 240 by bypassing the clock signal supplied from the multiplexer 260. If the calibration signal C_CAL is received from the control unit 250b, the calibration unit 280 supplies the corrected clock signal C_CLK to the second duty cycle error accumulation circuit 240 by correcting the duty cycle of the clock signal supplied from the multiplexer 260 based on the calibration signal C_CAL.

Meanwhile, the calibration unit 280 can be implemented in various forms to control the duty cycle of the clock signal.

In the initial operation of the duty cycle correction circuit 200b, the control unit 250b is operated in the first mode. In the first mode, the control unit 250b supplies the mode signal MD having the first logic level to the multiplexer 260. Thus, the multiplexer 260 supplies the output clock signal O_CLK to the calibration unit 280.

In the initial operation of the duty cycle correction circuit 200b, the control unit 250b may not output the calibration signal C_CAL. Therefore, the calibration unit 280 supplies the corrected clock signal C_CLK to the second duty cycle error accumulation circuit 240 by bypassing the clock signal supplied from the multiplexer 260 in the initial operation of the duty cycle correction circuit 200b.

Thus, the first and second duty cycle error accumulation circuits 230 and 240 can receive the same output clock signal O_CLK. If the rise transition time tRI of the first node ND1, the propagation delay time tINV1 of the first inverter 111, the fall transition time tFI of the first node ND1 and the propagation delay time tINV2 of the second inverter 112 included in the first duty cycle error accumulation circuit 230 may be same as the rise transition time tRI of the first node ND1, the propagation delay time tINV1 of the first inverter 111, the fall transition time tFI of the first node ND1 and the propagation delay time tINV2 of the second inverter 112 included in the second duty cycle error accumulation circuit 240, respectively, the number of bits that consecutively have the value of '0' in the first accumulation signal AS1 may be equal to the number of bits that consecutively have the value of '0' in the second accumulation signal AS2.

However, as described above, the rise transition time tRI of the first node ND1, the propagation delay time tINV1 of the first inverter 111, the fall transition time tFI of the first node ND1 and the propagation delay time tINV2 of the second inverter 112 included in the first duty cycle error accumulation circuit 230 may not be same as (or correspond to) the rise transition time tRI of the first node ND1, the propagation delay time tINV1 of the first inverter 111, the fall transition time tFI of the first node ND1 and the propagation delay time tINV2 of the second inverter 112 included in the second duty cycle error accumulation circuit 240, respectively, so the number of bits that consecutively have the value of '0' in the first accumulation signal AS1 may not be equal to the number of bits that consecutively have the value of '0' in the second accumulation signal AS2.

Accordingly, if the number of bits that consecutively have the value of '0' in the first accumulation signal AS1 is larger than the number of bits that consecutively have the value of '0' in the second accumulation signal AS2 in the first mode, the control unit 250b controls the calibration unit 280 through the calibration signal C_CAL to increase the width of the logic low level of the clock signal supplied from the multiplexer 260. In addition, if the number of bits that consecutively have the value of '0' in the second accumulation signal AS2 is larger than the number of bits that consecutively have the value of '0' in the first accumulation signal AS1 in the first mode, the control unit 250b controls the calibration unit 280 through the calibration signal C_CAL to reduce the width of the logic low level of the clock signal supplied from the multiplexer 260.

That is, the control unit 250b can compensate for the difference in parameters of the transistors and the inverters included in the first and second duty cycle error accumulation circuits 230 and 240 by controlling the duty cycle of the output clock signal O_CLK supplied to the second duty cycle error accumulation circuit 240.

Meanwhile, if the number of bits that consecutively have the value of '0' in the first accumulation signal AS1 is equal to the number of bits that consecutively have the value of '0' in the second accumulation signal AS2, the operation of the control unit 250b is switched into the second mode. In the second mode, the control unit 250b supplies the mode signal MD having the second logic level to the multiplexer 260.

Therefore, the multiplexer 260 supplies the inverse clock signal INV_CLK to the calibration unit 280 in the second mode. In the second mode, the control unit 250b generates the duty cycle correction signal C_CORR by comparing the number of bits that consecutively have the value of '0' in the first accumulation signal AS1 with the number of bits that consecutively have the value of '0' in the second accumulation signal AS2 and supplies the duty cycle correction signal C_CORR to the duty cycle control unit 210. Thus, the duty cycle control unit 210 can generate the output clock signal O_CLK, in which the length of the logic low level duration matches with the length of the logic high level duration, by correcting the duty cycle of the input clock signal I_CLK based on the duty cycle correction signal C_CORR.

The operation of the duty cycle correction circuit 200b in the second mode is identical to the operation of the duty cycle correction circuit 200 shown in FIG. 8. Since the operation of the duty cycle correction circuit 200 shown in FIG. 8 has been described in detail with reference to FIGS. 8 and 9, detailed description about the operation of the duty cycle correction circuit 200b will be omitted. The first duty cycle error accumulation circuit (DCEAC1) 230, the second duty cycle error accumulation circuit (DCEAC2) 240, the inverter 220, the multiplexer 260 and the calibration unit 280 may be referred to as a duty cycle error accumulating unit 290b to generate the first and second accumulation signal AS1 and AS2 in response to the clock signal O_CLK.

Figure 12:
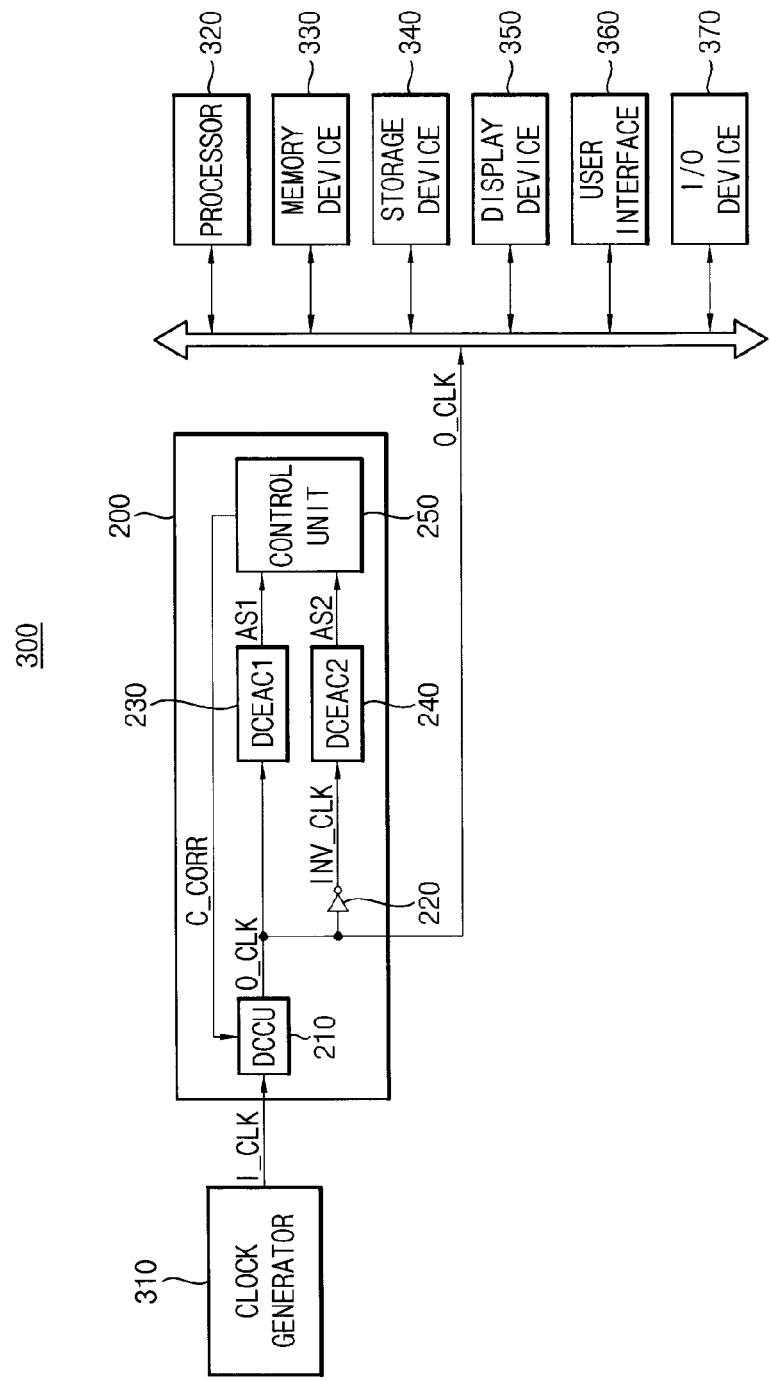
FIG. 12 is a block diagram illustrating an electronic apparatus according to an exemplary embodiment of the present general inventive concept.

FIG. 12 is a block diagram illustrating an electronic apparatus 300 according to an exemplary embodiment of the present general inventive concept.

Referring to FIG. 12, the electronic apparatus 300 includes a clock generator 310, a duty cycle correction circuit 200, a processor 320 and a memory device 330.

The clock generator 310 generates an input clock signal I_CLK required for an operation of the electronic apparatus 300.

The duty cycle correction circuit 200 generates an output clock signal O_CLK by correcting a duty cycle of the input clock signal I_CLK. The duty cycle correction circuit 200 includes a duty cycle control unit (DCCU) 210, an inverter 220, a first duty cycle error accumulation circuit (DCEAC1) 230, a second duty cycle error accumulation circuit (DCEAC2) 240 and a control unit 250. As illustrated in FIG. 12, the duty cycle correction circuit 200 of FIG. 12 is identical to the duty cycle correction circuit 200 of FIG. 8. Alternatively, the duty cycle correction circuit 200 of FIG. 12 may be embodied with one of the duty cycle correction circuit 200a of FIG. 10 and the duty cycle correction circuit 200b of FIG. 11. A structure and an operation of the duty cycle correction circuit of FIGS. 8, 10 and 11 are described above with reference to FIGS. 1 to 11, so detailed description about the duty cycle correction circuit 200 of FIG. 12 will be omitted.

The processor 320 writes data in the memory device 330 and reads data from the memory device 330 based on the output clock signal O_CLK. The processor 320 may perform various computing functions, such as executing specific software for performing specific calculations or tasks. For example, the processor 320 may be a microprocessor or a central process unit. The processor 320 may be connected to the memory device 330 via bus such as an address bus, a control bus or a data bus, etc. The processor 320 may be connected to an extended bus, such as peripheral component interconnect (PCI) bus.

The memory device 330 may store data for operations of the electronic apparatus 300. For example, the memory device 330 may be a double data rate (DDR) memory device. In this case, the memory device 330 may transfer and receive data at every rising edges and falling edges of the output clock signal O_CLK. Therefore, if a duty cycle error occurs in the output clock signal O_CLK such that a width of a logic low level and a width of a logic high level in the output clock signal O_CLK are different from each other, data communication between the processor 320 and the memory device 330 may fail. However, since the duty cycle correction circuit 200 generates the output clock signal O_CLK by correcting the duty cycle of the input clock signal I_CLK, the electronic apparatus 300 may prevent the data communication failure.

The electronic apparatus 300 may further include a storage device 340, a display device 350, a user interface 360 and an input/output device 370, as a functional unit to perform a function of the electronic apparatus 300. Although not illustrated in FIG. 12, the electronic apparatus 300 may further include ports to communicate with a video card, a sound card, a memory card, a universal serial bus (USB) device, etc., as the functional unit. The functional unit may include electrical and mechanical components to perform the function thereof.

The storage device 340 may store multimedia data. The storage device 340 may include a non-volatile memory device such as a flash memory device, a solid state drive (SSD), a hard disk drive (HDD), a compact disk read-only memory (CD-ROM) drive, etc.

The display device 350 may display the multimedia data. The display device 350 may include any type of devices such as an organic light emitting display (OLED) device, a liquid crystal display (LCD) device, etc.

The user interface 360 may include devices required for a user to control the electronic apparatus 300. The input/output device 370 may include at least one input device (e.g., a keyboard, keypad, a mouse, a touch screen, etc.) and/or at least one output device (e.g., a printer, a speaker, etc.).

The electronic apparatus 300 may include any of several types of electronic devices, such as a mobile device, a smart phone, a cellular phone, a personal digital assistant (PDA), a desktop computer, a laptop computer, a work station, a handheld device, a personal media player (PMP), a digital camera, or the like.

Figure 13:
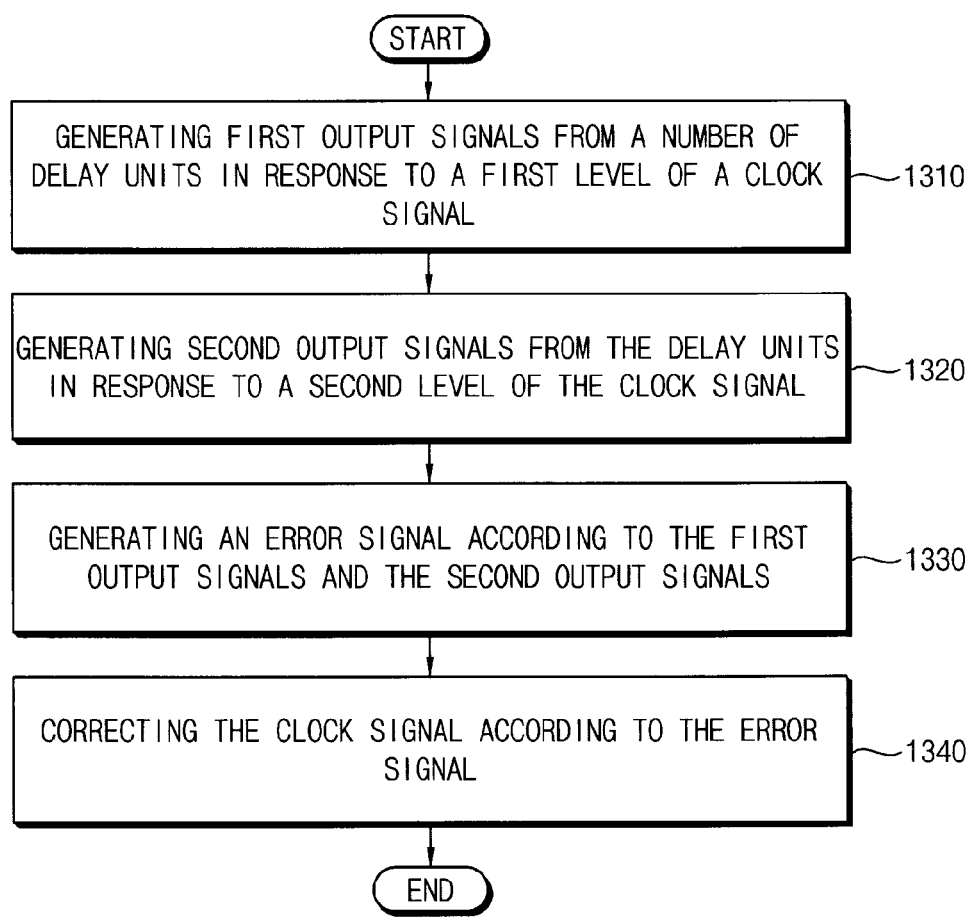
FIG. 13 is a flowchart illustrating a method of a duty cycle correction circuit according to an exemplary embodiment of the present general inventive concept.

FIG. 13 illustrates a method of a duty cycle error accumulation circuit usable with a duty cycle error correction circuit and also usable with an electronic apparatus according to an exemplary embodiment of the present general inventive concept. Referring to FIGS. 1 through 13, the first output signals AS are generated in the delay units 110-1 through 110-n during a first level (for example, logic low level) of the clock signal at operation 1310. The second output signals AS are generated in the delay units 110-n through 110-1 during a second level (for example, logic high level) of the clock signal at operation 1320. The operations 1310 and 1320 may repeat during every cycle of the clock signal. An error signal (error correction signal) is generated according to first and second accumulation signals AS1 and AS2 correspond to the first output signals and the second output signals at operation 1330. The clock signal is controlled (corrected or adjusted) according to the error signal in the duty cycle error correction circuit at operation 1340. The electronic apparatus may operate units and components connected therein with the accurately controlled clock signal.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A duty cycle error accumulation circuit, comprising:
   first to $n^{th}$ delay units (n is an integer of 2 or more) to receive a clock signal, a first input signal and a second input signal, respectively, to generate a first output signal and a second output signal by delaying one signal selected from the first and second input signals based on a logic level of the clock signal; and
   a feedback unit to supply the second input signal to a $k^{th}$ delay unit based on the second output signal of a $(k+1)^{th}$ delay unit (k is a positive integer of (n−1) or less),
   wherein the first output signal of the $k^{th}$ delay unit is supplied to the $(k+1)^{th}$ delay unit as the first input signal, and the clock signal is supplied to the first delay unit as the first input signal and to the $n^{th}$ delay unit as the second input signal.

2. The duty cycle error accumulation circuit of claim 1, wherein each of the first to $n^{th}$ delay units generates the first output signal by delaying the first input signal for a first time when the clock signal has a logic low level, and generates the second output signal by delaying the second input signal for a second time different from the first time when the clock signal has a logic high level.

3. The duty cycle error accumulation circuit of claim 1, wherein each of the first to $n^{th}$ delay units comprises:
   a first PMOS transistor including a drain, a source connected to a supply voltage, and a gate to which the clock signal is applied;
   a second PMOS transistor including a source connected to the drain of the first PMOS transistor, a drain connected to a first node, and a gate to which the first input signal is applied;
   a first NMOS transistor including a drain, a source connected to a ground voltage, and a gate to which the clock signal is applied;
   a second NMOS transistor including a source connected to the drain of the first NMOS transistor, a drain connected to the first node, and a gate to which the second input signal is applied;
   a first inverter that generates the first output signal by inversing a voltage of the first node; and
   a second inverter that generates the second output signal by inversing the voltage of the first node.

4. The duty cycle error accumulation circuit of claim 3, wherein the first and second PMOS transistors have an aspect ratio (W/L) higher than an aspect ratio of the first and second NMOS transistors.

5. The duty cycle error accumulation circuit of claim 3, wherein the first inverter has a threshold voltage higher than a threshold voltage of the second inverter.

6. The duty cycle error accumulation circuit of claim 1, wherein the feedback unit includes first to $(n-1)^{th}$ AND gates in which a $k^{th}$ AND gate supplies a result of an AND operation on the second output signal of the $(k+1)^{th}$ delay unit and the clock signal to the $k^{th}$ delay unit as the second input signal.

7. The duty cycle error accumulation circuit of claim 1, further comprising:
  a reset control unit to receive a reset signal and an input clock signal, to supply a signal maintained at a first logic level to the first to $n^{th}$ delay units and the feedback unit as the clock signal when the reset signal is activated, and to supply the input clock signal to the first to $n^{th}$ delay units and the feedback unit as the clock signal from a time point at which the input clock signal is transited into a second logic level when the reset signal is inactivated.

8. A duty cycle correction circuit, comprising:
  a duty cycle control unit to generate an output clock signal by correcting a duty cycle of an input clock signal based on a duty cycle correction signal;
  an inverter to generate an inverse clock signal by inversing the output clock signal;
  a first duty cycle error accumulation circuit having a first number of delay units to generate a first accumulation signal based on an accumulation length of a logic high level duration of the output clock signal and an accumulation length of a logic low level duration of the output clock signal for m periods (m is an integer of 2 or more);
  a second duty cycle error accumulation circuit having a second number of delay units to generate a second accumulation signal based on an accumulation length of a logic high level duration of the inverse clock signal and an accumulation length of a logic low level duration of the inverse clock signal for the m periods; and
  a control unit to generate the duty cycle correction signal by comparing the first accumulation signal with the second accumulation signal.

9. The duty cycle correction circuit of claim 8, wherein the first duty cycle error accumulation circuit receives the output clock signal as an internal clock signal, the second duty cycle error accumulation circuit receives the inverse clock signal as the internal clock signal, and each of the first and second duty cycle error accumulation circuits comprises:
  first to $n^{th}$ delay units (n is an integer of 2 or more) to receive the internal clock signal, a first input signal and a second input signal, respectively, to generate a first output signal and a second output signal by delaying one signal selected from the first and second input signals based on a logic level of the internal clock signal; and
  a feedback unit to supply the second input signal to a $k^{th}$ delay unit based on the second output signal of a $(k+1)^{th}$ delay unit (k is a positive integer of (n−1) or less),
  wherein the first output signal of the $k^{th}$ delay unit is supplied to the $(k+1)^{th}$ delay unit as the first input signal, and the internal clock signal is supplied to the first delay unit as the first input signal and to the $n^{th}$ delay unit as the second input signal, and
  wherein the first accumulation signal includes the first output signals of the first to $n^{th}$ delay units included in the first duty cycle error accumulation circuit and the second accumulation signal includes the first output signals of the first to $n^{th}$ delay units included in the second duty cycle error accumulation circuit.

10. The duty cycle correction circuit of claim 9, wherein the control unit controls the duty cycle control unit through the duty cycle correction signal to reduce a width of a logic low level of the input clock signal when a number of bits that consecutively have a value of 0 in the first accumulation signal is larger than a number of bits that consecutively have a value of 0 in the second accumulation signal, and controls the duty cycle control unit through the duty cycle correction signal to increase the width of the logic low level of the input clock signal when the number of bits that consecutively have the value of 0 in the first accumulation signal is smaller than the number of bits that consecutively have the value of 0 in the second accumulation signal.

11. The duty cycle correction circuit of claim 8, further comprising:
  a multiplexer to supply the output clock signal to the second duty cycle error accumulation circuit in a first mode and to supply the inverse clock signal to the second duty cycle error accumulation circuit in a second mode based on a mode signal; and
  a calibration unit to supply a corrected clock signal to the first duty cycle error accumulation circuit by correcting a duty cycle of the output clock signal based on a calibration signal,
  wherein the control unit supplies the mode signal to the multiplexer according to at least one of the first mode and the second mode, generates the calibration signal by comparing the first accumulation signal with the second accumulation signal in the first mode to supply the calibration signal to the calibration unit, and generates the duty cycle correction signal in the second mode to supply the duty cycle correction signal to the duty cycle control unit.

12. The duty cycle correction circuit of claim 11, wherein, in the first mode, the control unit controls the calibration unit through the calibration signal to reduce a width of a logic low level of the output clock signal when a number of bits that consecutively have a value of 0 in the first accumulation signal is larger than a number of bits that consecutively have a value of 0 in the second accumulation signal, controls the calibration unit through the calibration signal to increase the width of the logic low level of the output clock signal when the number of bits that consecutively have the value of 0 in the first accumulation signal is smaller than the number of bits that consecutively have the value of 0 in the second accumulation signal, and supplies the mode signal corresponding to the second mode to the multiplexer to operate in the second mode when the number of bits that consecutively have the value of 0 in the first accumulation signal is equal to the number of bits that consecutively have the value of 0 in the second accumulation signal.

13. The duty cycle correction circuit of claim 8, further comprising:
  a multiplexer to output the output clock signal in a first mode and to output the inverse clock signal in a second mode based on a mode signal; and
  a calibration unit to supply a corrected clock signal to the second duty cycle error accumulation circuit by correcting a duty cycle of an output signal of the multiplexer based on a calibration signal,
  wherein the control unit supplies the mode signal to the multiplexer according to a mode, generates the calibration signal by comparing the first accumulation signal with the second accumulation signal in the first mode to supply the calibration signal to the calibration unit, and generates the duty cycle correction signal in the second mode to supply the duty cycle correction signal to the duty cycle control unit.

14. The duty cycle correction circuit of claim 13, wherein, in the first mode, the control unit controls the calibration unit through the calibration signal to increase a width of a logic low level of the output signal of the multiplexer when a number of bits that consecutively have a value of 0 in the first accumulation signal is larger than a number of bits that consecutively have a value of 0 in the second accumulation signal, controls the calibration unit through the calibration signal to reduce the width of the logic low level of the output signal of the multiplexer when the number of bits that consecutively have the value of 0 in the first accumulation signal is smaller than the number of bits that consecutively have the value of 0 in the second accumulation signal, and supplies the mode signal corresponding to the second mode to the multiplexer to operate in the second mode when the number of bits that consecutively have the value of 0 in the first accumulation signal is equal to the number of bits that consecutively have the value of 0 in the second accumulation signal.

15. A duty cycle error accumulation circuit, comprising:
a plurality of delay units disposed to operate in a first order to generate a first set of accumulation signals during a first level of a clock signal and to operate in a second order to generate a second set of accumulation signals during a second level of the clock signal such that a difference between the first set of accumulation signals and the second set of accumulation signals indicates a duty cycle error of a cycle of the clock signal.

16. The duty cycle error accumulation circuit of claim 15, wherein:
the delay units are connected in series; and
each of the delay units is connected between two different potentials to receive a combination of one or more of the clock signal, an output signal generated from a first adjacent delay unit as a first input, an output signal generated from a second adjacent delay unit as a second input.

17. The duty cycle error accumulation circuit of claim 15, wherein:
the delay units each comprise a transistor group and a first converter and a second converter commonly connected to an output of the transistor group;
the first converter has a first threshold and the second converter has a second threshold; and
the first converters output the accumulation signals in the first order and in the second order according to the respective first and second levels according to the first threshold and the output of the transistor group.

18. The duty cycle error accumulation circuit of claim 15, wherein the delay units repeat the operations in the first order and the second order in the respective cycles of the clock signal to generate first sets of the accumulation signals and second sets of the accumulation signals such that a difference between the first sets of the accumulation signals and the second sets of the accumulation signal indicates the duty cycle error of the cycles of the clock signal.

19. A duty cycle error correction circuit comprising a duty cycle control unit, the duty cycle error accumulation circuits of claim 15 to generate the first and second set of accumulation signals, and a control unit to generate an error correction signal to control the duty cycle control unit to correct the duty cycle of the clock signal according to the error correction signal.

20. An electronic apparatus comprising a clock generator to generate the clock signal, the duty cycle error correction circuit of claim 19, and a functional unit to perform a function of the electronic apparatus according to the corrected clock signal.

* * * * *